(12) United States Patent  
Takemura

(10) Patent No.: US 9,336,836 B2  
(45) Date of Patent: May 10, 2016

(54) SEMICONDUCTOR MEMORY DEVICE AND DRIVING METHOD THEREOF

(71) Applicant: SEMICONDUCTOR ENERGY LABORATORY CO., LTD., Atsugi-shi, Kanagawa-ken (JP)

(72) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/559,993

(22) Filed: Dec. 4, 2014

(65) Prior Publication Data

US 2015/0138865 A1 May 21, 2015

Related U.S. Application Data

(62) Division of application No. 13/655,051, filed on Oct. 18, 2012, now Pat. No. 8,913,419.

(30) Foreign Application Priority Data

Oct. 24, 2011 (JP) .................................. 2011-232372

(51) Int. Cl.
*G11C 7/02* (2006.01)
*G11C 5/06* (2006.01)
*G11C 11/4094* (2006.01)
*G11C 11/4097* (2006.01)
*G11C 11/4063* (2006.01)

(52) U.S. Cl.
CPC .. *G11C 5/06* (2013.01); *G11C 7/02* (2013.01); *G11C 11/4063* (2013.01); *G11C 11/4094* (2013.01); *G11C 11/4097* (2013.01); *G11C 2207/002* (2013.01); *G11C 2207/005* (2013.01)

(58) Field of Classification Search
CPC ..... G11C 11/404; G11C 11/405; H01L 27/108
USPC .................................. 365/149, 205, 206, 207
See application file for complete search history.

(56) References Cited

U.S. PATENT DOCUMENTS 5,353,255 A 10/1994 Komuro
5,495,440 A 2/1996 Asakura
(Continued)

OTHER PUBLICATIONS

Takeuchi.K et al., "Channel Engineering for the Reduction of Random-Dopant Placement-Induced Threshold Voltage Fluctuation", IEDM 97: Technical Digest of International Electron Devices Meeting, Dec. 7, 1997, pp. 841-844.

*Primary Examiner* — Son Dinh
(74) *Attorney, Agent, or Firm* — Fish & Richardson P.C.

(57) ABSTRACT

A semiconductor memory device in which capacitance of a capacitor is lower and integration degree is higher. A plurality of memory blocks is connected to one bit line BL_m. A memory block MB_n_m includes a sub bit line SBL_n_m, a write switch, and a plurality of memory cells. A sub bit line SBL_n+1_m adjacent to the sub bit line SBL_n_m is connected to an amplifier circuit AMP_n/n+1_m including two inverters and two selection switches. A circuit configuration of the amplifier circuit can be changed with the selection switches. The amplifier circuit is connected to the bit line BL_m through a read switch. Because of a sufficiently low capacitance of the sub bit line SBL_n_m, potential change due to electric charges of the capacitor in each memory cell can be amplified by the amplifier circuit AMP_n/n+1_m without an error, and the amplified data can be output to the bit line BL_m.

14 Claims, 13 Drawing Sheets

(56) References Cited

U.S. PATENT DOCUMENTS

| | | |
|---|---|---|
| 6,151,260 A | 11/2000 | Birk |
| 6,373,765 B1 | 4/2002 | Birk |
| 6,992,928 B2 * | 1/2006 | Inoue .................. G11C 11/405 365/149 |
| 7,772,053 B2 | 8/2010 | Kameshiro et al. |
| 2007/0159903 A1 * | 7/2007 | Kim .................. G11C 11/405 365/207 |
| 2011/0156027 A1 | 6/2011 | Yamazaki et al. |
| 2012/0075917 A1 | 3/2012 | Takemura |
| 2012/0081948 A1 | 4/2012 | Takemura |

* cited by examiner

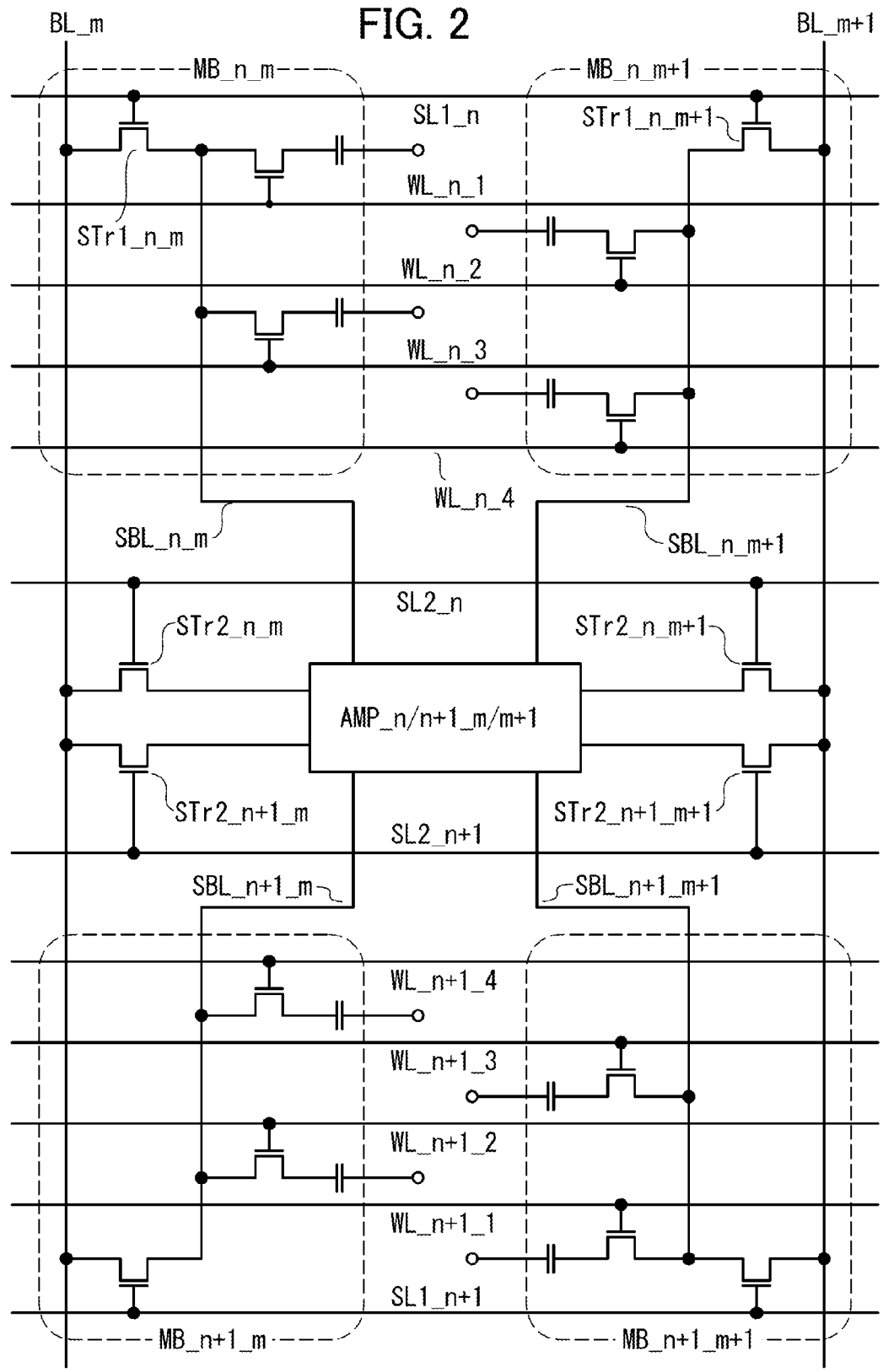

SEMICONDUCTOR MEMORY DEVICE AND DRIVING METHOD THEREOF

CROSS-REFERENCE TO RELATED APPLICATIONS

This application is a divisional of U.S. application Ser. No. 13/655,051, filed Oct. 18, 2012, now allowed, claims the benefit of a foreign priority application filed in Japan as Serial No. 2011-232372 on Oct. 24, 2011, both of which are incorporated by reference.

BACKGROUND OF THE INVENTION

1. Field of the Invention

The present invention relates to a memory device using a semiconductor.

2. Description of the Related Art

Terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

In this specification, the term "connection" means the state where effective direct current (DC) can be supplied or can be transmitted even if the state is temporary. Therefore, a state of connection means not only a state of direct connection but also a state of indirect connection through a circuit element such as a wiring, or a resistor, in which DC can be supplied or transmitted. Note that it does not matter whether or not a circuit is designed to be actually supplied with DC.

For example, in the case where a switching element is provided between two nodes, DC can be conditionally supplied (i.e., DC can be supplied only when the switching element is in an on state); therefore, in this case, the nodes are connected to each other. On the other hand, in the case where only a capacitor is provided between two nodes, effective DC cannot be supplied through the capacitor; therefore, in this case, the nodes are not connected to each other.

Similarly, in the case where only a diode is provided between two nodes, DC can be supplied when the potential of either node is higher; therefore, in this case, the nodes are connected to each other. In that case, even when a potential at which current does not flow is applied to the two nodes in circuit design (in this case, current does not flow between the two nodes through the diode), the two nodes are connected in this specification.

For example, when a nodeA is connected to a source of a transistor and a nodeB is connected to a drain of the transistor, DC can flow between the nodeA and the nodeB depending on the gate potential is appropriate; therefore, in this case, the nodeA and the nodeB are connected.

On the other hand, when the nodeA is connected to the source of the transistor and a nodeC is connected to a gate of the transistor, effective DC cannot flow between the nodeA and the nodeC regardless of the potentials of the source, the drain, and the gate of the transistor; therefore, in this case, the nodeA and the nodeC are not connected.

In the above description, "effective DC" means current except unintended currents such as leakage current. Note that the value of effective DC is not defined by its level (absolute value) but varies depending on circuits in some cases. In other words, a low current of 1 pA can be effective current in a circuit and in another circuit, a higher current of 1 μA is not regarded as effective current in some cases.

Needless to say, in one circuit having an input and an output (e.g., inverter), the input and the output are not necessarily connected in the circuit. For example, in an inverter, an input and an output are not connected.

Further, even when the term "connect" is used in this specification, there is a case in which a corresponding physical connecting portion is not clear and a wiring is only extended in an actual circuit. For example, in an insulated-gate field-effect transistor (hereinafter simply referred to as a transistor) circuit, there is a case in which one wiring serves as gates of a plurality of transistors. In that case, one wiring which branches into gates may be illustrated in a circuit diagram. Even in such a case, the expression "a wiring is connected to a gate" may be used in this specification.

In this specification, in the case where an element in a specific row, column, or location in a matrix is described, the element is denoted by reference letters with a symbol like "a first selection transistor STr1_$n$_m", "a bit line BL_m", or "a sub bit line SBL_n_m". Note that n and m are numbers showing a row, column, or location. When one element has a function relating to a plurality of rows or columns, the element can be denoted by "an amplifier circuit AMP_n/n+1_m", for example.

However, an element is for example denoted by "a first selection transistor STr1", "a bit line BL", or "a sub bit line SBL" or simply denoted by "a first selection transistor", "a bit line", or "a sub bit line" in some cases, particularly in the case where a row, column, or location does not specified, where a plurality of elements are correctively denoted, or where the location is obvious.

DRAM whose memory cell includes one transistor and one capacitor can be highly integrated, has no limit of write cycles in theory, and can perform write and read at relatively high speed; thus, such DRAM is used in many kinds of electronic appliances. DRAM stores data by accumulating electric charges in a capacitor of each memory cell, and reads the data by releasing the electric charges.

A capacitor in miniaturized DRAM is formed to have a trench with a depth of as much as several micrometers and/or a protrusion with a height of as much as several micrometers, which increases difficulties in processing. Enhancement of productivity requires the capacitor to have a shape that can be easily processed. However, for that purpose, a reduction in capacitance is required, which causes the following problems, for example.

One problem caused by a lower capacitance of the capacitor is that intervals between refresh operations are shorten, which results in defective DRAM. For example, assuming that the capacitance of the capacitor is 1 fF, which is one thirtieth of conventional capacitance, the frequency of refresh operations needs to be 30 times as high as the conventional frequency of refresh operations, in which case not only smooth write or read of data is hampered but also more power is consumed.

At the time of data write in DRAM, including at the time of refresh operations, much of current flowing in a bit line is used for charging and discharging of capacitance of the bit line (including parasitic capacitance formed between a bit line and another wiring or the like) in addition to for charging of a capacitor of a memory cell. In the present situation, current ten times or more as high as current needed for charging and discharging of the capacitor of the memory cell is used for charging and discharging of the capacitance of the bit line.

Needless to say, charging and discharging of capacitance of the bit line is a phenomenon not related to data retention, and performing refresh operation leads to an increase in power consumption. Accordingly, an increase in frequency of refresh operations is not preferable because the increase leads to higher power consumption. In other words, a reduction in frequency of refresh operations is highly effective in a reduction in power consumption.

Another problem is an increase in read error. When data is read from DRAM, a slight change in potential of a bit line is amplified. The change is generated by discharging electric charges, which are accumulated in a capacitor, to the bit line.

Parasitic capacitance is between a bit line and a wiring intersecting therewith or the adjacent bit line, and is usually much higher than the capacitance of a capacitor. An extremely high capacitance of the bit line leads to extremely slight change in potential of the bit line, which is the change generated when the electric charges that are accumulated in the capacitor are discharged to the bit line; as a result, an error occurs in amplifying the change in the potential. Accordingly, the capacitance of the capacitor is desirably 10% or higher of the capacitance of the bit line.

As for the first problem, it is found that for example, the use of a semiconductor with an extremely high off resistance can markedly reduce leakage from the capacitor (see Patent Document 2). In addition, it is known that an extremely thin silicon film has off resistance higher than normal silicon by about three orders of magnitude because of the quantum effect (see Patent Document 3).

As for the second problem, a method as disclosed in Patent Document 1 is suggested in which the capacitance of the capacitor is reduced by providing a sub bit line that has a lower capacitance than the bit line and is connected to the bit line, and by connecting a sense amplifier of a flip-flop circuit type to the sub bit line. However, although the semiconductor memory device disclosed in Patent Document 1 can have a folded bit line structure, the semiconductor memory device cannot have an open bit line structure that is more highly integrated.

The sense amplifier of a flip-flop circuit type is apt to fail to work properly when the capacitance of the sub bit line is low. In general, the potential of an object with a low capacitance greatly changes because of an influence of noise. Conventional DRAM has a capacitance of bit line of several hundred femtofarads; however, based on the simplest assumption, when the capacitance of sub bit line is several femtofarads, a change in potential due to noise is increased hundredfold.

In the sense amplifier of a flip-flop circuit type, a slight potential difference of about 0.1 V is amplified in an early stage of amplification. At this time, when a change in potential other than signals becomes 0.1 V or higher, an error occurs. For example, assuming that a change in potential due to noise at an arbitrary level is 1 mV when the capacitance of the bit line is several hundred femtofarads, an error hardly occurs in a process of amplification. However, when the capacitance of the bit line (or the sub bit lines) is several femtofarads, a change in potential due to noise that is at the same level as the above; as a result, an error is apt to occur in the process of amplification.

In other words, in the semiconductor memory device disclosed in Patent Document 1, a read error is apt to occur when the capacitance of the sub bit line is greatly reduced. In the semiconductor memory device disclosed in Patent Document 1, an extremely high off resistance of a transistor is not expected and the capacitance of the sub bit line is expected to be several hundred femtofarads or higher; therefore, Patent Document 1 does not disclose any solution against the case where the capacitance of the sub bit line is several ten femtofarads or lower, for example.

In addition, in order that a potential difference of as slight as 0.1 V be amplified in such a manner, variations between threshold values of the transistors used for the sense amplifier of a flip-flop circuit type are required to be small. For example, when respective two n-channel transistors that are included in a flip-flop circuit have threshold values of +0.35 V and +0.45 V, these n-channel transistors are concurrently turned on in some cases in the process of amplification, which results in failure in data reading.

In general, a variation between the threshold values of transistors used in a flip-flop circuit is required to be less than half, preferably less than 30%, of a potential difference between bit lines in the early stage of amplification (in the above case, 0.1 V). In the above case, a variation between the threshold values of the transistors is 50 mV and a potential difference between the bit lines in the early stage of the amplification is 0.1 V; therefore, an error is apt to occur in the amplification.

Variations between the threshold values of the transistors are classified into three types: variations between lots (variations between substrates), variations between chips (variations in characteristics of chips obtained from a substrate), and variations between adjacent transistors. Variations between lots depend on difference in process condition, film thickness, or line width between lots. Variations between chips are attributed to variations in dose, film thickness, or line width in the substrate. Any of these variations is microscopic and a variation in threshold value due to these factors can be compensated by a substrate bias or the like so as to obtain needed threshold values.

On the other hand, variations between adjacent transistors mainly depend on statistical fluctuation of dopant concentration (see Non Patent Document 1). Thus, the smaller the transistor becomes, the larger the variation becomes. In other words, miniaturization of a transistor for highly integrated DRAM results in operational instability of the sense amplifier of a flip-flop circuit type.

REFERENCE

Patent Document

[Patent Document 1] U.S. Pat. No. 5,353,255
[Patent Document 2] United States Patent Application Publication No. 2011/0156027
[Patent Document 3] U.S. Pat. No. 7,772,053

Non-Patent Document

[Non-Patent Document 1] K. Takeuchi et al., "Channel Engineering for the Reduction of Random-Dopant-Placement-Induced Threshold Voltage Fluctuation", Technical Digest of International Electron Devices Meeting, pp. 841-844, 1997.

SUMMARY OF THE INVENTION

An object of one embodiment of the present invention is to provide a highly integrated semiconductor memory device which sufficiently operates even when the capacitance of a capacitor is lower than or equal to that in conventional DRAM, specifically 1 fF or lower, preferably 0.1 fF or lower. An object of one embodiment of the present invention is to provide a semiconductor memory device which sufficiently operates even when the capacitance of a capacitor is ten times or less as high as the gate capacitance of a transistor used, preferably two times or less as high as the gate capacitance of the transistor used. An object of one embodiment of the present invention is to provide a highly integrated semiconductor memory device.

An object of one embodiment of the present invention is to provide a memory device having a novel structure or a method for driving the memory device. In particular, it is an object of an embodiment of the present invention to provide a memory device in which power consumption can be reduced and a driving method by which power consumption can be reduced.

One embodiment of the present invention is a semiconductor memory device that includes a bit line, two or more word lines, a first memory block, and a second memory block. Each memory block has two or more memory cells and a sub bit line.

The sub bit line of the first memory block is connected to an input terminal of a first inverter and a first selection switch. An output terminal of the first inverter is connected to the sub bit line of the second memory block through a second selection switch.

The sub bit line of the second memory block is connected to an input terminal of a second inverter and the second selection switch. An output terminal of the second inverter is connected to the sub bit line of the first memory block through the first selection switch.

The output terminal of the first inverter is connected to the bit line through a first read switch. The output terminal of the second inverter is connected to the bit line through a second read switch.

One embodiment of the present invention is a semiconductor memory device that includes a first bit line, a second bit line, two or more word lines, and first to fourth memory blocks. Each memory block includes two or more memory cells, a sub bit line, and a write switch. The write switch is connected to the sub bit line.

The write switch of the first memory block and the write switch of the second memory block are connected to the first bit line. The write switch of the third memory block and the write switch of the fourth memory block are connected to the second bit line.

The sub bit line of the first memory block is connected to an input terminal of a first inverter through a first selection switch. The sub bit line of the second memory block is connected to the input terminal of the first inverter through a second selection switch. The sub bit line of the third memory block is connected to an input terminal of a second inverter through the third selection switch. The sub bit line of the fourth memory block is connected to the input terminal of the second inverter through a fourth selection switch.

An output terminal of the first inverter is connected to the second bit line through a first read switch. An output terminal of the second inverter is connected to the first bit line through a second read switch.

One embodiment of the present invention is a semiconductor memory device that includes a bit line and a sub bit line. The sub bit line is connected to the bit line through a first inverter and a second inverter. A first selection switch in an on state and a second selection switch in an off state are between the first inverter and the second inverter. A first read switch in an on state is between the bit line and the first inverter. A second read switch in an off state is between the bit line and the second inverter.

In the above, the write switch, the read switch, or the selection switch can be formed using one or more transistor. In the simplest structure, each of them can be one n-channel transistor or one p-channel transistor. Alternatively, each of them may be a transfer gate in which two or more transistors with different conductivities are connected in parallel.

A transistor included in the write switch of one memory block may be provided in a different layer from one transistor in one of memory cells. A transistor included in the write switch of one memory block may include a different kind of semiconductor from one transistor in one of the memory cells. In one memory block, one transistor in one of the memory cells may be provided in a different layer from one transistor of another memory cell.

One memory block may include 4 to 64 memory cells. A necessary depth or a necessary height for a capacitor of the memory cell may be 1 µm or less, preferably 0.3 µm or less. In particular, when a necessary height for the capacitor is 0.3 µm or less, a bit line over capacitor (BOC) structure can be employed.

As the inverter, various kinds of inverters can be used. For example, a complementary inverter, a resistive load inverter, a clocked inverter, or the like, or a combination thereof can be used.

It is preferable that the inverter be provided in a different layer from the transistor of the memory cell and employ a single crystal semiconductor. The inverter needs sufficient prevention of variations between the threshold values of the transistors; accordingly, the channel area in the inverter is preferably four times or more, more preferably 16 times or more as large as those of the transistors in the memory cell.

The length in the word line direction of the part occupied by the inverter is preferably three times or more, more preferably five times or more, as large as the width of the bit line. Similarly, the length in the bit line direction of the part occupied by the inverter, is preferably three times or more, more preferably five times or more, as large as the width of the word line.

The inverter occupies a large area as described above; however, provision of the memory cell in a different layer from the inverter (i.e., three-dimensional provision) achieves a reduction in area actually needed for the semiconductor memory device. Sufficient enlargement of the channel area of the transistor in the inverter reduces variations between the threshold values of the transistors due to statistical fluctuation of dopant concentration.

One embodiment of the present invention is a method for driving a semiconductor memory device with any of the above structures. In the driving method, at least one of the first read switch and the second read switch is turned on in a period during which only any one of the first selection switch and the second selection switch is turned on.

By employing any of the above-described structures, at least one of the above-described objects can be achieved. In the above structure, electric charges corresponding to the potential of the sub bit line are output from the inverter and accumulated in the bit line. Since the capacitance of the sub bit line is low as described above, the potential of the sub bit line greatly vary. However, when the variations are averaged in a predetermined time, the potential of the sub bit line is almost constant. In other words, electric charges accumulated in the bit line (and the potential due to electric charge) reflect the potential of the sub bit line.

Note that as described above, in conventional DRAM, there is not only a problem of difficulty in manufacturing a structure body with a high aspect ratio, but also a problem of greater difficulty in improving the memory density by manufacturing a memory device having a multilayer structure with the use of such structure bodies. When one embodiment of the present invention in which such a structure body is not needed is utilized in view of the above problem, a multilayer technique in which a memory cell is stacked over a memory cell can be realized.

Further, in the case of employing a BOC structure, the area of the memory cell can be $6F^2$ (F: feature size). In conventional DRAM employing a stacked-type capacitor, two memory cells share one bit line contact; thus, the area of the memory cell has approached $6F^2$. In that case, however, the bit line needs to be provided to avoid the capacitor; therefore, the actual area of the memory cell has become larger than $6F^2$.

On the other hand, it has been known that a BOC structure can achieve a memory cell area of $6F^2$; however, the structure cannot be employed when the height of the capacitor is larger than 1 μm. In one embodiment of the present invention, the capacitance of the capacitor can be 1 fF or lower, preferably 0.1 fF or lower, and a capacitor with a high aspect ratio, which is included in conventional DRAM, is not necessary.

As a result, a BOC structure can be employed, which permits an increase in integration degree, a reduction in the number of manufacturing steps, and/or an improvement in yield. Note that the three-dimensionally formed transistor in the memory cell allows the memory cell to have an area of $4F^2$.

As an alternative to a BOC structure, the bit line and the sub bit line may be provided under the transistor in the memory cell (on the substrate side) and over the transistor in the memory cell, respectively. Alternatively, the bit line and the sub bit line may be provided over the transistor in the memory cell and under the transistor in the memory cell, respectively. Since the sub bit line is provided to overlap with the bit line in either case, the integration degree is increased.

One embodiment of the present invention utilizes the feature in which the characteristics of an inverter that is formed using transistors with a value of a variation between threshold values are more stable than the characteristics of a flip-flop circuit formed using transistors with the same value of variations. For example, in the case where a sense amplifier of a flip-flop circuit type is formed using transistors whose variation between threshold values is 50 mV, a malfunction occurs as described above when a potential difference of 0.1 V is amplified. On the other hand, when an inverter is formed using transistors whose variation between threshold values is 50 mV, the potential of an output of the inverter is lower than a reference potential in the case where the potential of the sub bit line in read is higher than the reference potential by 0.1 V, and the potential of an output of the inverter is higher than a reference potential in the case where the potential of the sub bit line is lower than the reference potential by 0.1 V. Therefore, in any case, a malfunction hardly occurs.

BRIEF DESCRIPTION OF THE DRAWINGS

FIG. 2 is a diagram illustrating an example of a circuit of a semiconductor memory device of the present invention.

DETAILED DESCRIPTION OF THE INVENTION

Hereinafter, embodiments will be described with reference to the drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Note that specific values are given below as potentials for the purpose of aid for understanding a technical idea of the present invention. Needless to say, such values may be changed in accordance with various characteristics of a transistor, a capacitor, or the like, or for convenience of the practitioner. Further, the semiconductor memory device described in this embodiment can write or read data using a method other than a method described below.

Embodiment 1

Figure 1A:
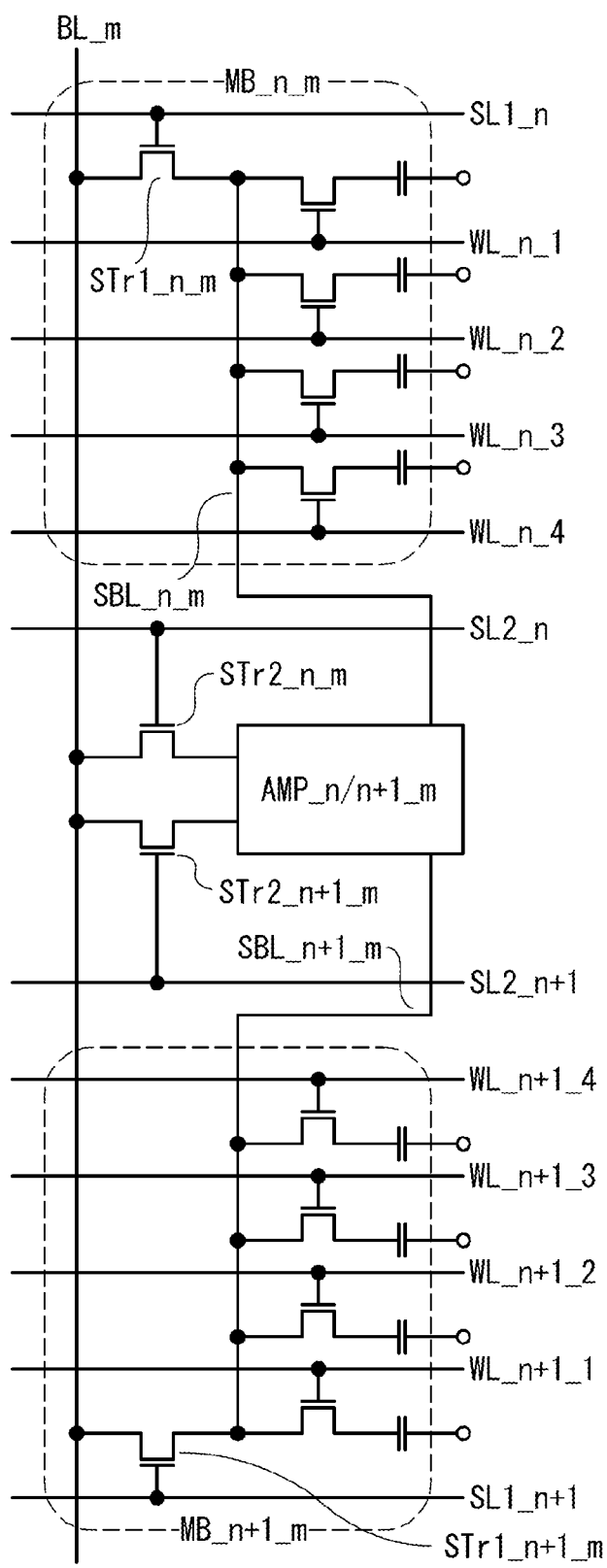
FIGS. 1A and 1B are diagrams for illustrating examples of a circuit of a semiconductor memory device of the present invention.
Figure 1B:
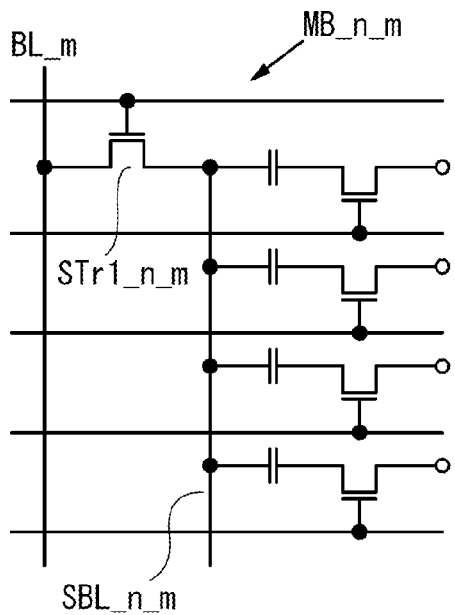
Figure 4A:
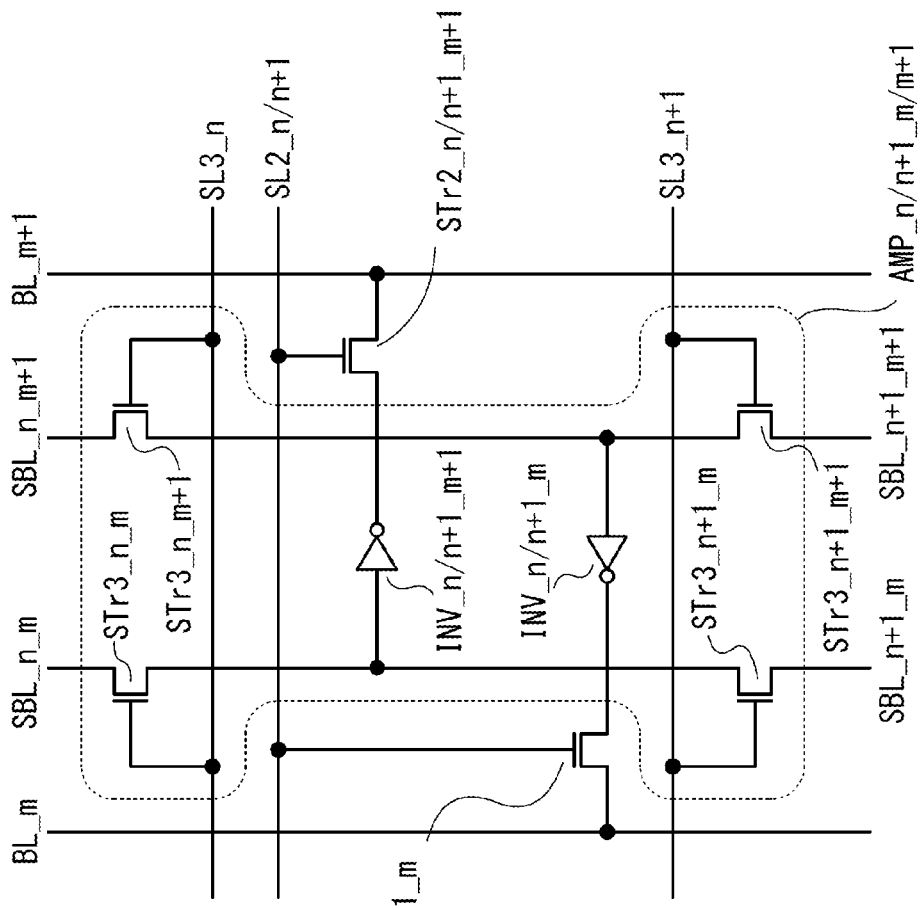
FIGS. 4A and 4B are diagrams for illustrating examples of a circuit of a semiconductor memory device of the present invention.

FIG. 1A, FIG. 1B, and FIG. 4A illustrate an example of the semiconductor memory device of this embodiment. FIG. 1A illustrates a memory block MB_n_m, a memory block MB_n+1_m, a bit line BL_m, a first selection line SL1_$n$, a first selection line SL1_$n$+1, word lines WL_n_1 to WL_n_4, and word lines WL_n+1_1 to WL_n+1_4. The bit line BL, the first selection lines SL1, and the word lines WL are connected to either or both of the memory blocks MB.

Further, FIG. 1A illustrates a second selection transistor STr2_$n$_m, a second selection transistor STr2_$n$+1_m, an amplifier circuit AMP_n_m, and an amplifier circuit AMP_n+1_m. The second selection transistors STr2_$n$_m and STr2_$n$+1_m are controlled by a second selection lines SL2_$n$ and SL2_$n$+1, respectively.

In FIG. 1A, the memory block MB_n_m includes four memory cells. Needless to say, the number of memory cells may be three or less, or five or more. Each memory cell includes one transistor and one capacitor. A gate of the transistor is connected to the word line WL, a drain of the transistor is connected to the sub bit line SBL_n_m, and a source of the transistor is connected to one electrode of the capacitor. The other electrode of the capacitor is connected to a node supplying a constant potential.

The memory block MB_n_m includes a first selection transistor STr1_n_m whose gate is connected to the first selection line SL1_n, source is connected to the sub bit line SBL_n_m, and drain is connected to the bit line BL_m. Note that it is possible to employ a structure where the first selection transistor STr1_n_m is not provided and the sub bit line SBL_n_m and the bit line BL_m are always in a non-conduction state at the part. In that case, the first selection line SL1_n accompanied by the first selection transistor is not necessary. The detail is described in Embodiment 5.

Capacitance including parasitic capacitance exists at the sub bit line SBL_n_m. The capacitance is preferably 10 times or less as high as the capacitance of the capacitor in the memory cell. The capacitance of the sub bit line SBL_n_m also includes the gate capacitance of a transistor that is provided in the amplifier circuit AMP_n_m connected to the sub bit line SBL_n_m. The gate capacitance of the transistor provided in the amplifier circuit AMP_n_m varies by the potential of the gate of the transistor and the maximum gate capacitance is preferably lower than or equal to the half of the capacitance of the sub bit line SBL_n_m.

Note that the structure of the memory block is not limited to that shown in FIG. 1A. For example, as illustrated in FIG. 1B, the structure in which one electrode of the capacitor of the memory cell is connected to the sub bit line SBL_n_m, the gate of the transistor is connected to the word line WL, the drain of the transistor is connected to the node supplying a constant potential, and the source of the transistor is connected to the other electrode of the capacitor may be employed. In this case, the node (a wiring or the like) supplying a constant potential to the drain is provided to be parallel with the word line, and does not hamper integration.

With such a structure, when electric charges of the capacitor are discharged to the sub bit line SBL_n_m, the potential of the sub bit line SBL_n_m is hardly affected by the potential of the word line WL through the gate capacitance of the transistor. The effect becomes obvious when the capacitance of the capacitor is 10 times or less, in particular two times or less, as high as the gate capacitance, for example.

As illustrated in FIG. 1A, the potential of the sub bit line SBL_n_m is input to the amplifier circuit AMP_n_m. An output terminal of the amplifier circuit AMP_n_m is connected to the bit line BL_m through the second selection transistor STr2_n_m or the second selection transistor STr2_n+1_m.

The amplifier circuit AMP is formed using two inverters and two switches for changing the circuit configuration. Although the amplifier circuit of this embodiment uses two inverters and two switches, the amplifier circuit is formed using one inverter and one switch for each memory block in practice because two memory blocks use one amplifier circuit.

FIG. 4A illustrates an example of the amplifier circuit AMP. As illustrated in FIG. 4A, a loop of an inverter INV_n_m and an inverter INV_n+1_m is formed between the sub bit line SBL_n_m and a sub bit line SBL_n+1_m. A third selection transistor STr3_n_m and a third selection transistor STr3_n+1_m as switches are provided at two points in the loop. FIG. 4A illustrates a switch formed using one transistor, but the switch may be formed using a plurality of transistors.

An output terminal of the inverter INV_n_m is connected to the bit line BL_m through the second selection transistor STr2_n+1_m. In addition, an output terminal of the inverter INV_n+1_m is also connected to the bit line BL_m through the second selection transistor STr2_n_m.

The third selection transistor STr3_n+1_m is provided between the output terminal of the inverter INV_n_m and an input terminal of the inverter INV_n+1_m. The third selection transistor STr3_n_m is provided between the output terminal of the inverter INV_n+1_m and an input terminal of the inverter INV_n_m. The third selection transistor STr3_n_m and the third selection transistor STr3_n+1_m are controlled by a third selection line SL3_n and a third selection line SL3_n+1, respectively.

In such a circuit configuration, one or more of the second selection transistor STr2_n_m, the second selection transistor STr2_n+1_m, the third selection transistor STr3_n_m, and the third selection transistor STr3_n+1_m are turned on and the others are turned off, so that a different circuit configuration can be obtained.

For example, when the second selection transistor STr2_n_m and the third selection transistor STr3_n+1_m are turned on and the others are off, the following path (first path) is completed: the sub bit line SBL_n_m→the inverter INV_n_m→the third selection transistor STr3_n+1_m→the inverter INV_n+1_m→the second selection transistor STr2_n_m→the bit line BL_m.

Further, when the second selection transistor STr2_n+1_m and the third selection transistor STr3_n_m are turned on and the others are off, the following path (second path) is completed: the sub bit line SBL_n+1_m→the inverter INV_n+1_m→the third selection transistor STr3_n_m→the inverter INV_n_m→the second selection transistor STr2_n+1_m→the bit line BL_m.

Two inverters are on either path; therefore, the potential having the same phase as that of the inputted potential (the potential of the sub bit line SBL) is output to the bit line BL_m. In such an amplifier circuit, an amplified potential is output to the bit line having a higher capacitance; accordingly, the potential of the bit line is hardly affected by noise even when the capacitance of the sub bit line SBL is low. Therefore, the probability of occurrence of a malfunction due to noise is low. Thus, read errors can be reduced even in the case where the capacitance of the sub bit line is 10 fF or lower.

Since the inverters in two stages are connected in series to amplify a potential, in comparison with the case of using only one inverter is used, current driving capability can be higher and the potential of the bit line can be a predetermined potential for a shorter time; accordingly, time for reading data can be shorter. Needless to say, data reading speed can be higher as the number of stages (preferably, an even number of stages) of inverters provided in series in a circuit layout is increased.

Note that there is the case where sufficient amplification cannot be achieved because of variations between the threshold values of transistors forming the inverter. However, the phase of an outputted potential is rarely different from that is needed to be obtained; accordingly, errors can be reduced in that respect. When the amplification is insufficient, a sense amplifier is connected to the bit line for amplification, whereby the insufficiency can be compensated. Even when amplification by the inverter is insufficient, an absolute value of the difference between the potential of the bit line and the reference potential is sufficiently large; therefore, an error hardly occurs in amplification by the sense amplifier.

An example of a method for reading data from the semiconductor memory device illustrated in FIG. 1A and FIG. 4A is described with reference to FIGS. 5A to 5C and FIG. 6. Here, data of the memory cell connected to the word line WL_n_2 in the memory block MB_n_m is read, and then, data of the memory cell connected to the word line WL_n+1_3 in the memory block MB_n+1_m is read.

In this embodiment, the capacitance of the sub bit line SBL is nine times as high as the capacitance of the capacitor of the memory cell. Further, the inverter INV_n_m and the inverter INV_n+1_m are active from the beginning.

Output potentials of the inverter INV_n_m and the inverter INV_n+1_m in a steady state are changed depending on input potentials. In the following example, output potentials are assumed to be +1 V, +1 V, +0.7 V, +0.5 V, +0.3 V, 0 V, and 0 V when respective input potentials are 0 V, +0.3 V, +0.45 V, +0.5 V, +0.55 V, +0.7 V, and +1 V.

First, the sub bit line SBL_n_m of the memory block MB_n_m is precharged to +0.5 V. The sub bit line SBL_n+1_m of the memory block MB_n+1_m is not necessary to be precharged. Here, the potential of the sub bit line SBL_n+1_m is assumed to be +1 V, which is kept at the last read or write potential. In order to precharge the sub bit line SBL_n_m to +0.5 V, the first selection transistor STr1_n_m is turned on by controlling the potential of the first selection line SL1_n (T1 in FIG. 6).

At this time, the inverter INV_n_m and the inverter INV_n+1_m output the potentials corresponding to the input potentials. For example, the output potential of the inverter INV_n_m is +0.5 V when the input potential is +0.5 V, and the output potential of the inverter INV_n+1_m is 0 V when the input potential is +1 V (see FIG. 5A).

After that, the first selection transistor STr1_n_m is turned off. Further, by controlling the potential of the word line WL_n_2, the transistor of the memory cell connected to the word line WL_n_2 is turned on (T2 in FIG. 6). As a result, the potential of the sub bit line SBL_n_m is +0.55 V.

The transistor of the memory cell connected to the word line WL_n_2 is turned on; concurrently, the third selection transistor STr3_n+1_m is turned on by controlling the potential of the third selection line SL3_n+1. The potential of the sub bit line SBL_n_m becomes +0.55 V, and accordingly, the output potential of the inverter INV_n_m becomes +0.3 V.

Note that the timing at which the third selection transistor STr3_n+1_m is turned on may be either before or after T2.

Figure 5A:
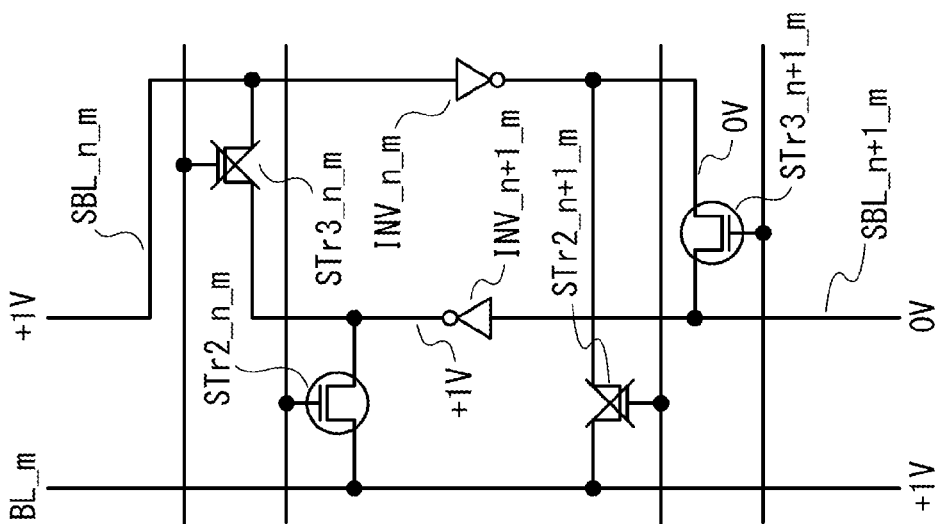
FIGS. 5A to 5C are diagrams illustrating an example of a method for driving a semiconductor memory device of the present invention.
Figure 5B:
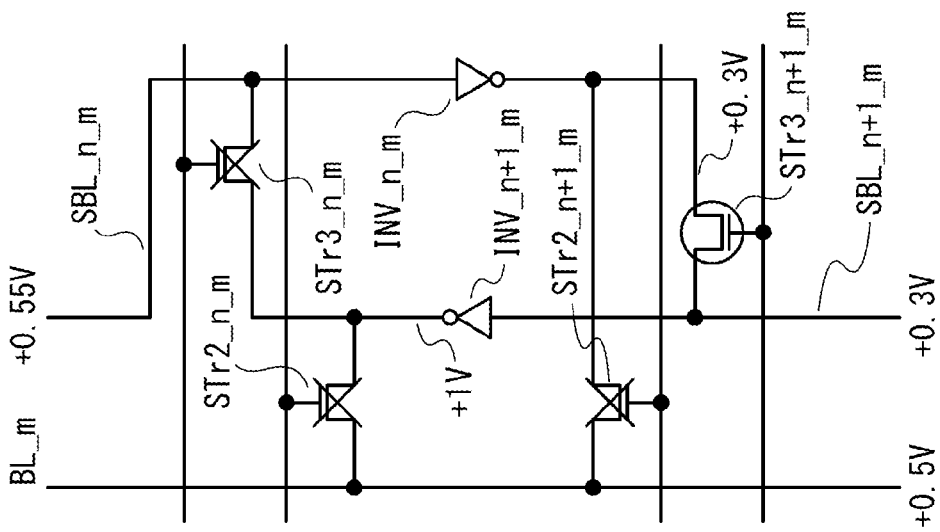
Figure 5C:
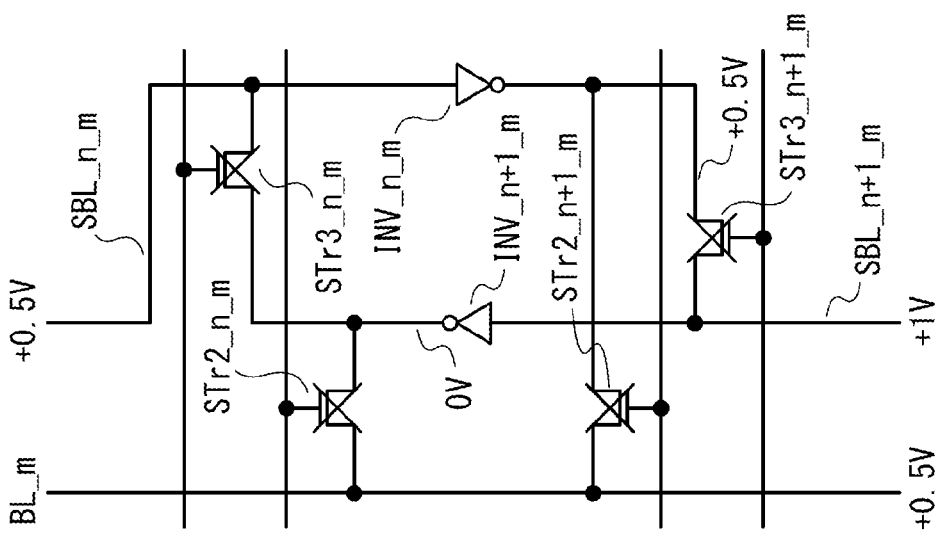

As a result, the potential of the sub bit line SBL_n+1_m is +0.3 V and the input potential of the inverter INV_n+1_m is also +0.3 V; therefore, the output potential of the inverter INV_n+1_m is +1 V (see FIG. 5B).

Figure 6:
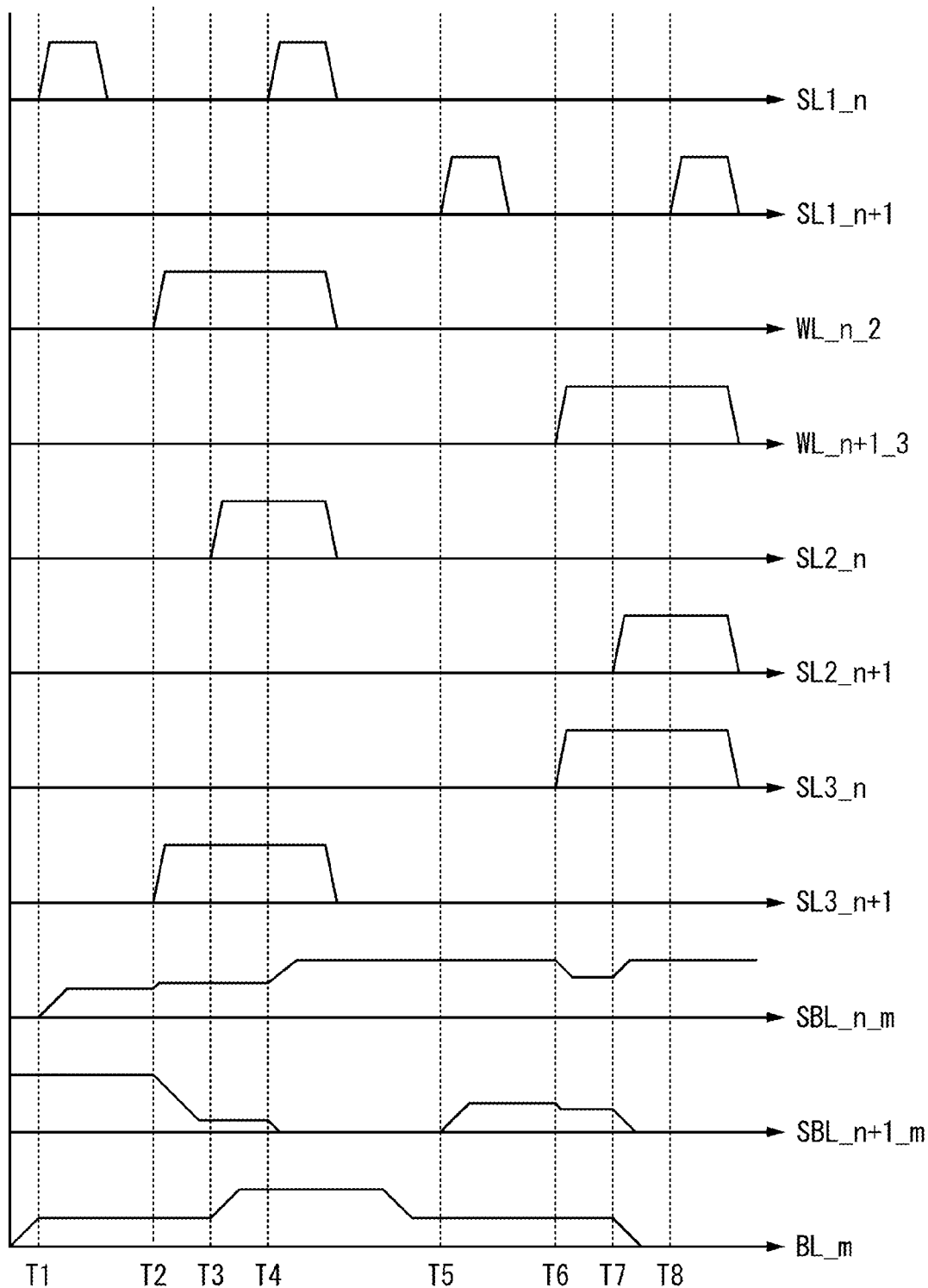
FIG. 6 is a timing chart showing an example of a method for driving a semiconductor memory device of the present invention.

After that, the second selection transistor STr2_n_m is turned on by controlling the potential of the second selection line SL2_n (T3 in FIG. 6). As a result, the potential of the bit line BL_m is increased to +1 V. Since the bit line BL_m has high capacitance and high wiring resistance in comparison with the sub bit line SBL, it takes a longer time for increasing the potential. When the potential of the bit line BL_m is stabilized to some extent, the first selection transistor STr1_n_m is turned on (T4 in FIG. 6).

In that case, errors can be reduced by waiting for sufficiently stabilizing the potential of the bit line BL_m. By turning on the first selection transistor STr1_n_m, a loop (the sub bit line SBL_n_m→the inverter INV_n_m→the third selection transistor STr3_n+1_m→the inverter INV_n+1_m→the second selection transistor STr2_n_m→the bit line BL_m→the first selection transistor STr1_n_m→the sub bit line SBL_n_m) in which two inverters are connected, like a flip-flop circuit is completed.

When the loop is formed in a state where the potential of the bit line BL_m is not very different from +0.5 V (e.g., +0.45 V or higher and +0.55 V or lower), the potential of the loop might be inverted because of noise. The loop is preferably completed in a state where the potential of the bit line BL_m is sufficiently different from +0.5 V (e.g., higher than +0.7 V or lower than +0.3 V).

Alternatively, the third selection transistor STr3_n_m may be turned on almost at the same time as when the first selection transistor STr1_n_m is turned on. As a result, a flip-flop circuit with the following path is made: the third selection transistor STr3_n_m→the inverter INV_n_m→the third selection transistor STr3_n+1_m→the inverter INV_n+1_m→the third selection transistor STr3_n_m. Since at this time, the potential of the bit line BL_m is already at the level at which the potential is hardly affected by noise, the operation seldom becomes unstable.

The first selection transistor STr1_n_m (or the third selection transistor STr3_n_m) is turned on, whereby the potential of the sub bit line SBL_n_m becomes +1 V. Since in that case, the transistor of the memory cell connected to the word line WL_n_2 is in an on state, the capacitor of the memory cell is charged; as a result, data of the memory cell is restored. Note that the potential of the sub bit line SBL_n_m is further increased, and thus the output potential of the inverter INV_n_m becomes 0 V; thus, the potential of the sub bit line SBL_n+1_m becomes 0 V (see FIG. 5C).

Through the above steps, reading and restoring the data in the memory cell connected to the word line WL_n_2 are completed. The first selection transistor STr1_n_m, the second selection transistor STr2_n_m, the third selection transistor STr3_n_m, and the third selection transistor STr3_n+1_m are turned off.

Next, data in the memory cell connected to the word line WL_n+1_3 is read. The potential of the bit line BL_m is set at +0.5 V in order to precharge the sub bit line SBL_n+1_m to +0.5 V, and by controlling the potential of the first selection line SL1_n+1, a first selection transistor STr1_n+1_m is turned on (T5 in FIG. 6).

After that, the first selection transistor STr1_n+1_m is turned off. Then, by controlling the potential of the word line WL_n+1_3, the transistor of the memory cell connected to the word line WL_n+1_3 is turned on (T6 in FIG. 6). As a result, the potential of the sub bit line SBL_n+1_m is +0.45 V.

At this time, the inverter INV_n_m and the inverter INV_n+1_m output the potentials corresponding to the input potentials. Since the potential of the sub bit line SBL_n_m is +1 V, the output potential of the inverter INV_n_m is 0 V. Since the potential of the sub bit line SBL_n+1_m is +0.45 V, the output potential of the inverter INV_n+1_m is +0.7 V.

The transistor of the memory cell connected to the word line WL_n+1_3 is turned on; concurrently, the third selection transistor STr3_n_m is turned on by controlling the potential of the third selection line SL3_n. As a result, the potential of the sub bit line SBL_n_m becomes +0.7 V and the input potential of the inverter INV_n_m also becomes +0.7 V; therefore, the output potential of the inverter INV_n+1_m is 0 V.

After that, the second selection transistor STr2_n+1_m is turned on by controlling the potential of the second selection line SL2_n+1 (T7 in FIG. 6). As a result, the potential of the bit line BL_m is decreased. When the potential of the bit line BL_m is stabilized to some extent, the first selection transistor STr1_n+1_m is turned on (T8 in FIG. 6). As a result, the potential of the sub bit line SBL_n+1_m is 0 V.

Since in that case, the transistor of the memory cell connected to the word line WL_n+1_3 is in an on state, the capacitor of the memory cell is charged; as a result, data of the memory cell is restored. Note that the potential of the sub bit line SBL_n+1_m is further decreased, and the output potential of the inverter INV_n+1_m becomes +1 V; thus, the potential of the sub bit line SBL_n_m becomes 0 V. Through the above steps, reading and restoring the data in the memory cell connected to the word line WL_n+1_3 are completed.

Note that in the case of rewriting data of the memory cell connected to the word line WL_n+1_3, the potential of the bit line BL_m may be set to a potential based on data to be rewritten while the transistor of the memory cell connected to the first selection transistor STr1_$n$+1_m and the word line WL_n+1_3 is in an on state. In addition, the second selection transistor STr2_$n$+1_m is turned off at that time, whereby data write can be completed with lower power and shorter time.

In the above example, the inverter INV is always active. However, the inverter INV may be active only when needed to reduce more power consumption. For example, it is possible that the inverter INV_n_m is active from T2 to T4 and T7 to T8 in FIG. 6 and the inverter INV_n+1_m is active from T3 to T4 or T6 to T8 in FIG. 6. Time to activate the inverter INV is limited in this manner, whereby shoot-through current of the inverter can be suppressed and power consumption can be reduced.

Embodiment 2

FIG. 2 illustrates an example of the semiconductor memory device of this embodiment. FIG. 2 illustrates a memory block MB_n_m, a memory block MB_n_m+1, a memory block MB_n+1_m, and a memory block MB_n+1_m+1. In addition, a bit line BL_m, a bit line BL_m+1, a first selection line SL1_$n$, a first selection line SL1_$n$+1, word lines WL_n_1 to WL_n_4, word lines WL_n+1_1 to WL_n+1_4, which connect the memory blocks, are illustrated. The bit line BL, the first selection lines SL1, and the word lines WL are connected to one or more of the memory blocks MB. The memory block MB may have the structure illustrated in FIG. 1B.

In addition, FIG. 2 illustrates a second selection transistor STr2_$n$_m, a second selection transistor STr2_$n$_m+1, a second selection transistor STr2_$n$+1_m, a second selection transistor STr2_$n$+1_m+1, and an amplifier circuit AMP_n/n+1_m/m+1.

The second selection transistor STr2_$n$_m and the second selection transistor STr2_$n$_m+1 are controlled by a second selection line SL2_$n$. The second selection transistor STr2_$n$+1_m and the second selection transistor STr2_$n$+1_m+1 are controlled by the second selection line SL2_$n$+1.

Note that if the second selection transistor STr2_$n$_m and the second selection transistor STr2_$n$_m+1 output the same potential to the bit line BL_m and the bit line BL_m+1, respectively, only one of the second selection transistor STr2_$n$_m and the second selection transistor STr2_$n$_m+1 may be provided. The same can be applied to the second selection transistor STr2_$n$+1_m and the second selection transistor STr2_$n$+1_m+1. In such a case, two second selection transistors STr2 connected to the amplifier circuit AMP_n/n+1_m/m+1 may be provided.

In the semiconductor memory device of this embodiment, one word line WL is connected to only the memory cell in one of adjacent two memory blocks: the memory block MB_n_m and the memory block MB_n_m+1 (or the memory block MB_n+1_m and the memory block MB_n+1_m+1).

For that reason, when the word line WL_n_1 is selected in reading data, for example, only one memory cell in the memory block MB_n_m is activated; accordingly, the potential of a sub bit line SBL_n_m becomes the potential including one-bit data of the memory cell. On the other hand, change in the potential of the sub bit line SBL_n_m+1 by selecting the word line WL_n_1 does not occur.

The potential of the sub bit line SBL_n_m and the potential of the sub bit line SBL_n_m+1 are amplified by the amplifier circuit AMP_n/n+1_m/m+1 so as to be output to the bit line BL_m or the bit line BL_m+1, or the potential difference is amplified. Thus, one-bit data can be read.

Figure 12:
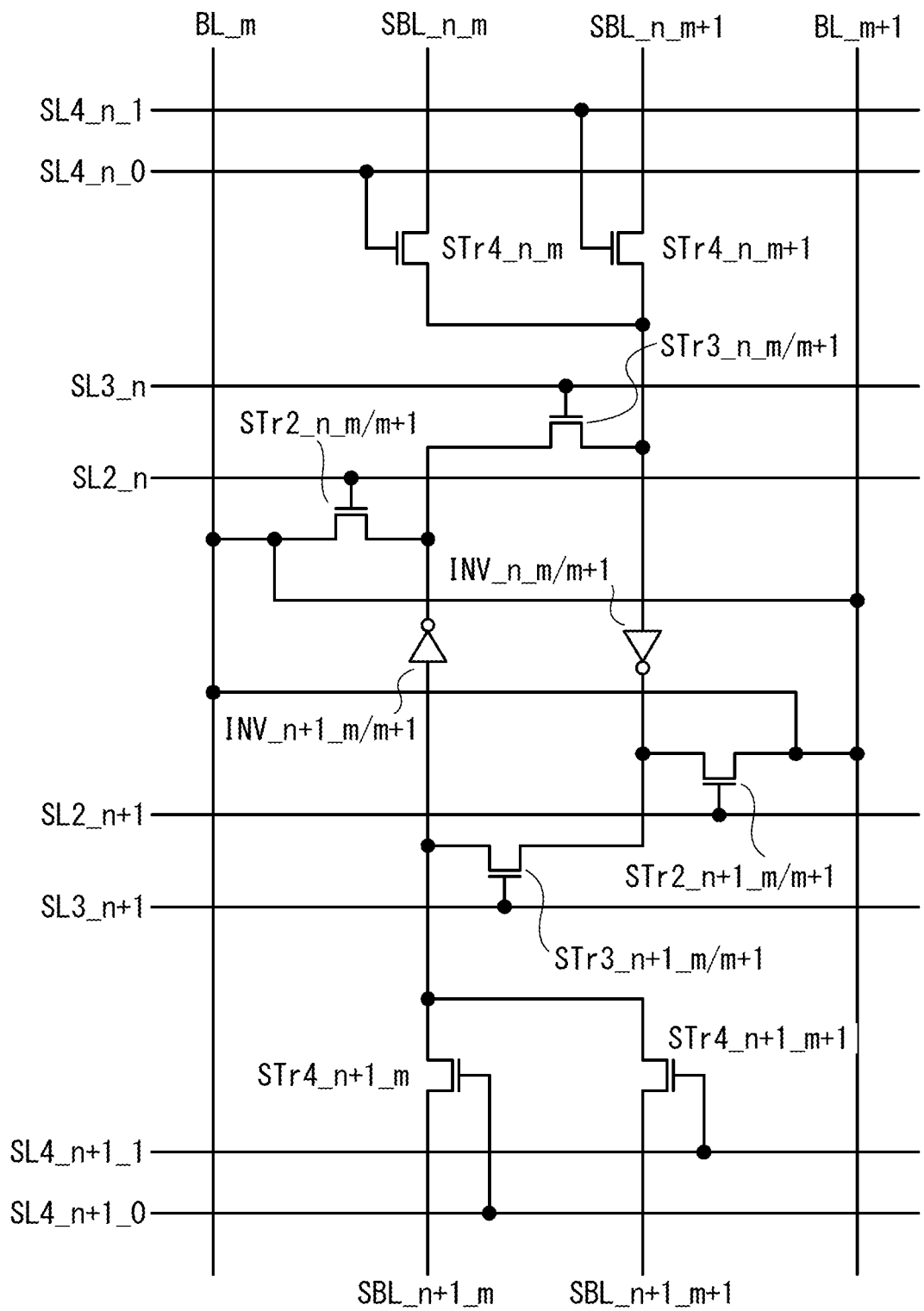
FIG. 12 is a diagram illustrating an example of a circuit of a semiconductor memory device of the present invention.

The amplifier circuit AMP_n/n+1_m/m+1 includes four input terminals and four (or two) output terminals. FIG. 12 illustrates an example of such an amplifier circuit. A circuit illustrated in FIG. 12 is formed using two inverters and six switches for changing a circuit configuration in addition to a second selection transistor STr2_$n$_m/m+1 and a second selection transistor STr2_$n$+1_m/m+1. Although the amplifier circuit of this embodiment uses two inverters and six switches, the amplifier circuit is formed using 0.5 inverters and 1.5 switches for each memory block in practice because four memory blocks use one amplifier circuit.

As illustrated in FIG. 12, the sub bit line SBL_n_m is connected to an input terminal of an inverter INV_n_m/m+1 through a fourth selection transistor STr4_$n$_m. The sub bit line SBL_n_m+1 is connected to the input terminal of the inverter INV_n_m/m+1 through a fourth selection transistor STr4_$n$_m+1. The sub bit line SBL_n+1_m is connected to an input terminal of an inverter INV_n+1_m/m+1 through the fourth selection transistor STr4_$n$+1_m. A sub bit line SBL_n+1_m+1 is connected to the input terminal of the inverter INV_n+1_m/m+1 through a fourth selection transistor STr4_$n$+1_m+1.

The fourth selection transistor STr4_$n$_m, the fourth selection transistor STr4_$n$_m+1, the fourth selection transistor STr4_$n$+1_m, and the fourth selection transistor STr4_$n$+1_m+1 are controlled by a fourth selection line SL4_$n$_0, a fourth selection line SL4_$n$_1, a fourth selection line SL4_$n$+1_0, and a fourth selection line SL4_$n$+1_1, respectively.

An output terminal of the inverter INV_n_m/m+1 is connected to the bit line BL_m and the bit line BL_m+1 through the second selection transistor STr2_$n$+1_m/m+1. An output terminal of the inverter INV_n+1_m/m+1 is connected to the bit line BL_m and the bit line BL_m+1 through the second selection transistor STr2_$n$_m/m+1. The second selection transistor STr2_$n$_m/m+1 and the second selection transistor STr2_$n$+1_m/m+1 are controlled by the second selection line SL2_$n$, the second selection line SL2_$n$+1, respectively.

Further, the output terminal of the inverter INV_n_m/m+1 is connected to the input terminal of the inverter INV_n+1_m/m+1 through a third selection transistor STr3_$n$+1_m/m+1. The output terminal of the inverter INV_n+1_m/m+1 is connected to the input terminal of the inverter INV_n_m/m+1 through a third selection transistor STr3_$n$_m/m+1. The third selection transistor STr3_$n$_m/m+1 and the third selection transistor STr3_$n$+1_m/m+1 are controlled by a third selection line SL3_$n$ and a third selection line SL3_$n$+1, respectively.

The above circuit is the circuit formed by adding the fourth selection transistor STr4_$n$_m, the fourth selection transistor STr4_$n$_m+1, the fourth selection transistor STr4_$n$+1_m, and the fourth selection transistor STr4_$n$+1_m+1, which can be separately controlled, to the circuit shown in Embodiment 1.

For example, in order to read data of the memory cell connected to the sub bit line SBL_n_m, the fourth selection transistor STr4_$n$_m and the third selection transistor STr3_$n$+1_m/m+1 are turned on; therefore, similarly to the structure described in Embodiment 1, the sub bit line SBL_n_m and two inverters can be connected in series.

Embodiment 3

Figure 3:
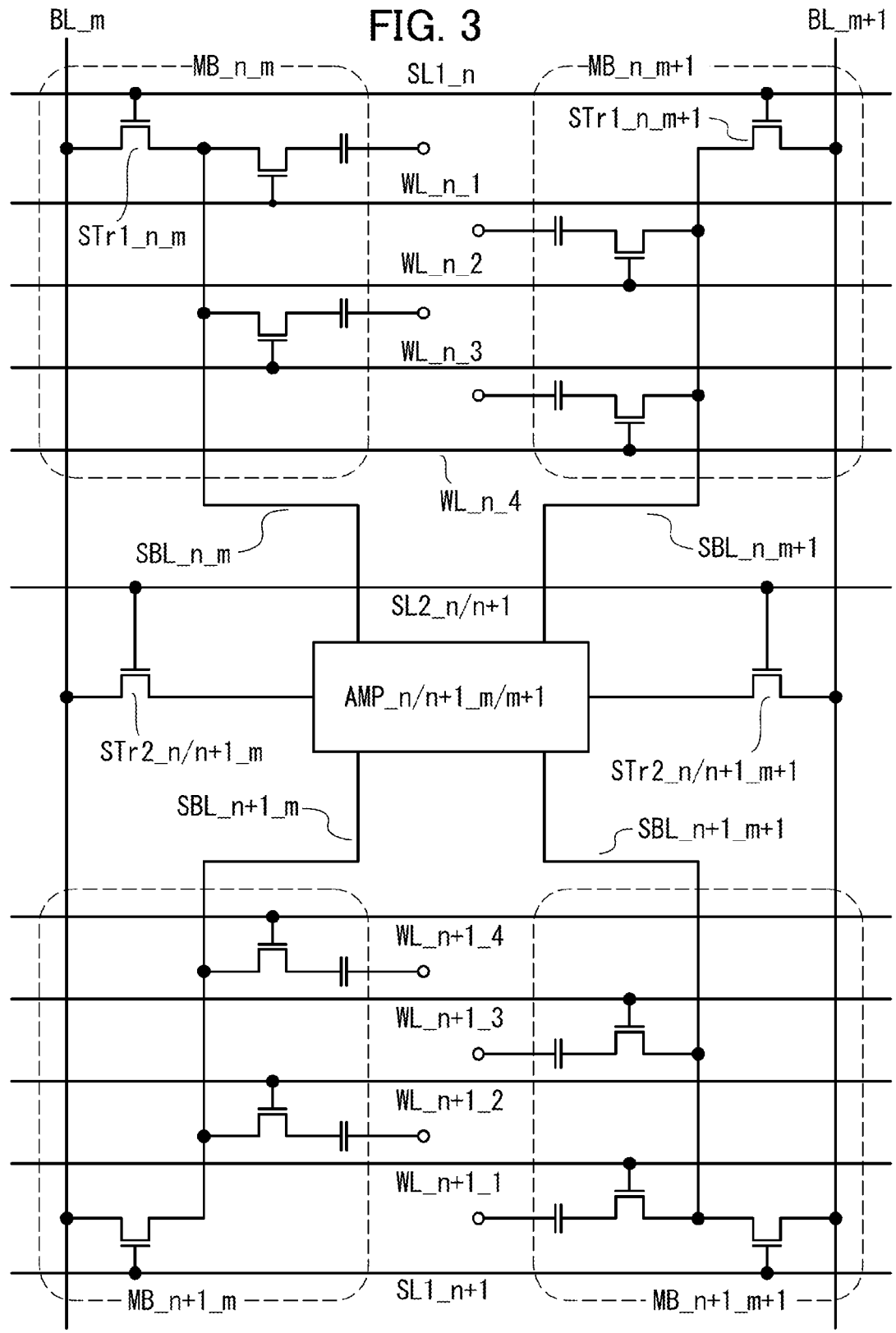
FIG. 3 is a diagram illustrating an example of a circuit of a semiconductor memory device of the present invention.

FIG. 3 illustrates an example of the semiconductor memory device of this embodiment. The semiconductor memory device of this embodiment includes two second selection transistors STr2 while the semiconductor memory device in FIG. 2 needs four second selection transistors STr2. The two second selection transistors STr2 operate in synchronization with each other.

Figure 4B:
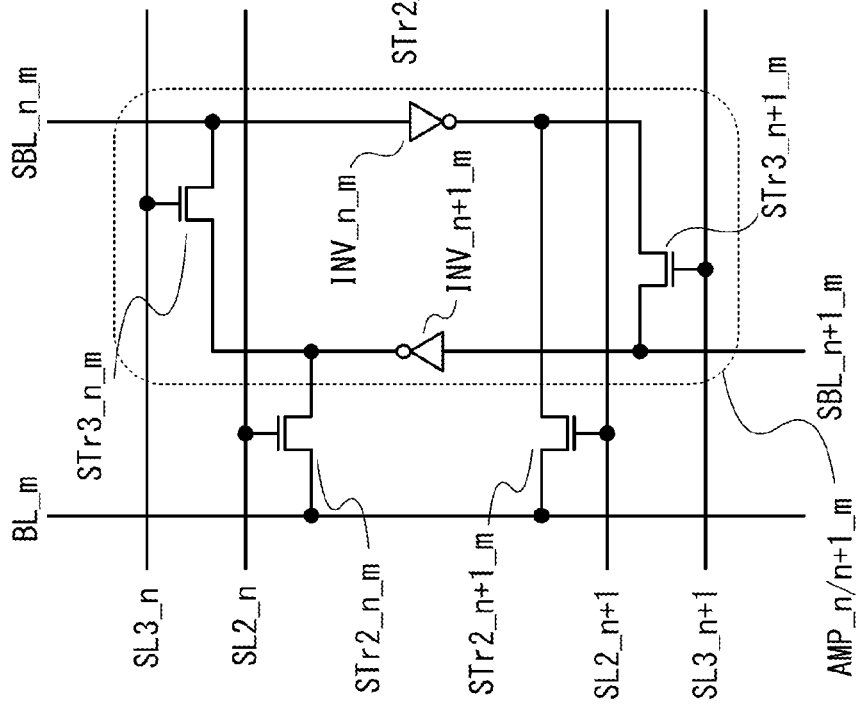

An amplifier circuit AMP_n/n+1_m/m+1 includes four input terminals and two output terminals. FIG. 4B illustrates an example of such an amplifier circuit. The amplifier circuit AMP in FIG. 4B is formed using two inverters and four switches for changing a circuit configuration. Although the amplifier circuit uses two inverters and six switches, the amplifier circuit is formed using 0.5 inverters and one switch for each memory block in practice because four memory blocks use one amplifier circuit.

As illustrated in FIG. 4B, a sub bit line SBL_n_m is connected to an input terminal of an inverter INV_n/n+1_m+1 through a third selection transistor STr3_n_m. A sub bit line SBL_n+1_m is connected to the input terminal of the inverter INV_n/n+1_m+1 through a third selection transistor STr3_n+1_m.

Similarly, a sub bit line SBL_n_m+1 is connected to an input terminal of an inverter INV_n/n+1_m through a third selection transistor STr3_n_m+1. A sub bit line SBL_n+1_m+1 is connected to the input terminal of the inverter INV_n/n+1_m through a third selection transistor STr3_n+1_m+1.

An output terminal of the inverter INV_n/n+1_m+1 is connected to a bit line BL_m+1 through a second selection transistor STr2_n/n+1_m+1. An output terminal of the inverter INV_n/n+1_m is connected to a bit line BL_m through a second selection transistor STr2_n/n+1_m. The second selection transistor STr2_n/n+1_m and the second selection transistor STr2_n/n+1_m+1 are controlled by a second selection line SL2_n/n+1 and operate in synchronization with each other.

Note that the third selection transistor STr3_n_m and the third selection transistor STr3_n_m+1 may operate in synchronization with each other. The third selection transistor STr3_n+1_m and the third selection transistor STr3_n+1_m+1 may operate in synchronization with each other.

Figure 7A:
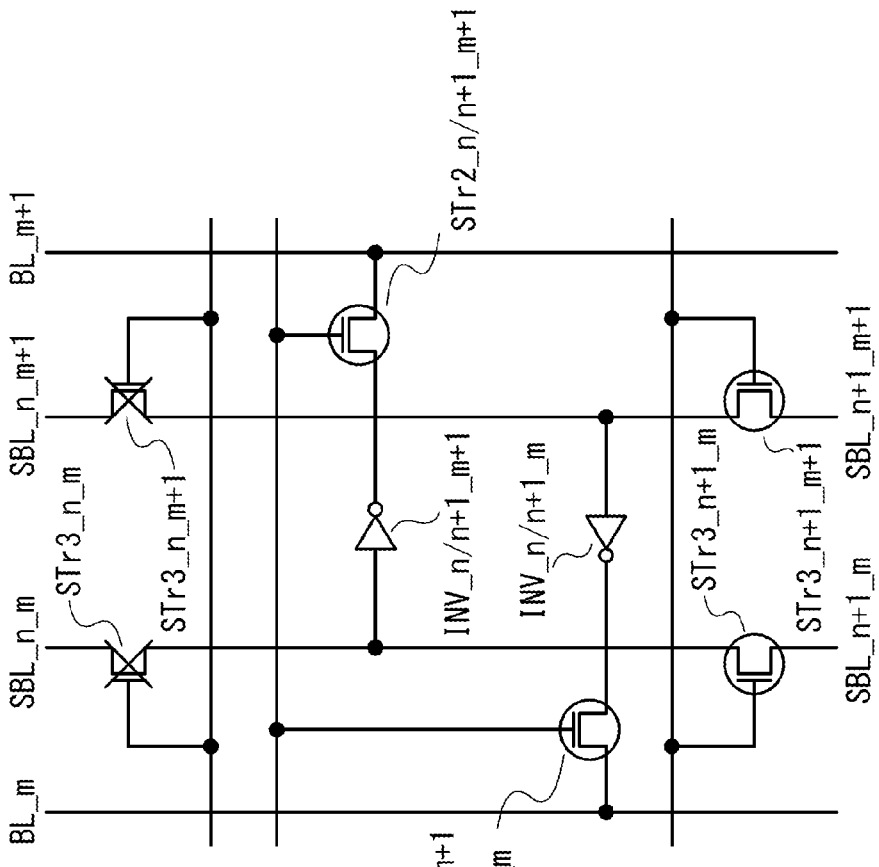
FIGS. 7A and 7B are diagrams illustrating an example of a method for driving a semiconductor memory device of the present invention.
Figure 7B:
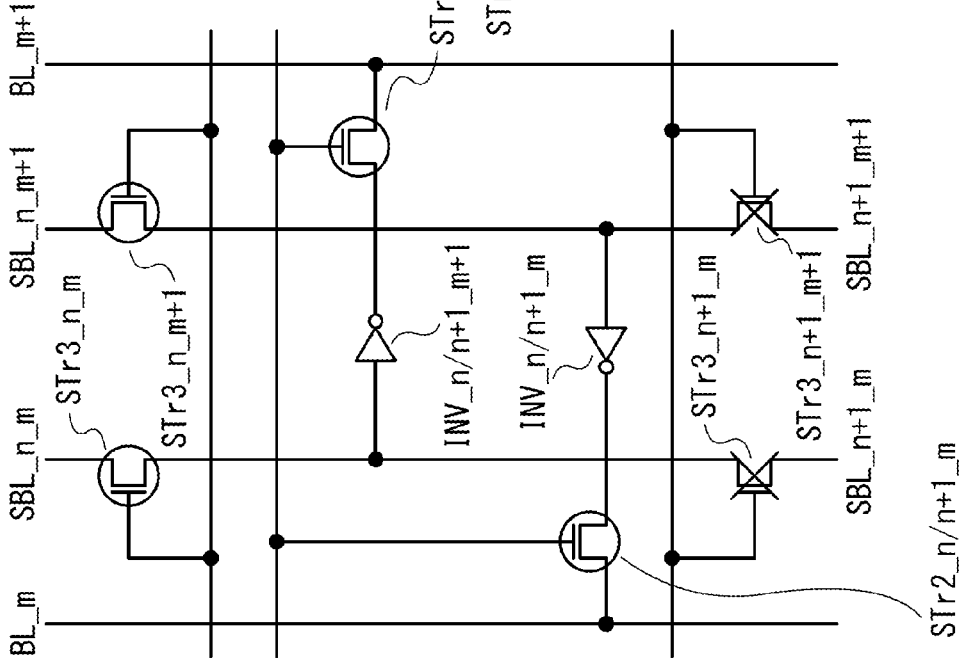

An example of operation of such a circuit is described with reference to FIGS. 7A and 7B. For example, when data of the memory cell connected to the word line WL_n_3 is read, the third selection transistor STr3_n_m and the third selection transistor STr3_n_m+1 are turned on. Further, the second selection transistor STr2_n/n+1_m and the second selection transistor STr2_n/n+1_m+1 are turned on.

The potential of the sub bit line (the sub bit line SBL_n_m) connected to the memory cell that is connected to the word line WL_n_3 includes the data. The potential of the other sub bit line (the sub bit line SBL_n_m+1) is not changed.

In any case, the potentials of these sub bit lines are input to the inverter INV_n/n+1_m and the inverter INV_n/n+1_m+1, and the potentials of the bit line BL_m and the bit line BL_m+1 correspond to outputs of the inverter INV_n/n+1_m and the inverter INV_n/n+1_m+1. The input potentials of the inverters are different and therefore output potentials are also different. The potential difference is amplified by the inverters.

When the potential difference between the bit line BL_m and the bit line BL_m+1 becomes large to some extent, it is preferable that the potential difference between the bit line BL_m and the bit line BL_m+1 be further amplified by using a sense amplifier (not illustrated) connected to the bit line BL_m and the bit line BL_m+1. After that, by turning on the first selection transistor STr1 in a manner similar to that described in Embodiment 1, the data that is the same as the read data can be written to the memory cell from which the data has been read.

For example, when data of the memory cell connected to the word line WL_n+1_2 is read, the third selection transistor STr3_n+1_m and the third selection transistor STr3_n+1_m+1 are turned on. In addition, the second selection transistor STr2_n/n+1_m and the second selection transistor STr2_n/n+1_m+1 are turned on (see FIG. 7B). The potentials corresponding to outputs of these inverters are supplied to the bit line BL_m and the bit line BL_m+1. After that, the potential difference is preferably amplified similarly to the above.

Embodiment 4

In this embodiment, an example of the semiconductor memory device of one embodiment of the present invention will be described with reference to FIG. 8, FIGS. 9A to 9C, FIGS. 10A to 10C, and FIG. 11. Note that in this embodiment, the parts with the same hatch pattern indicate that they are the same kind of element.

Figure 8:
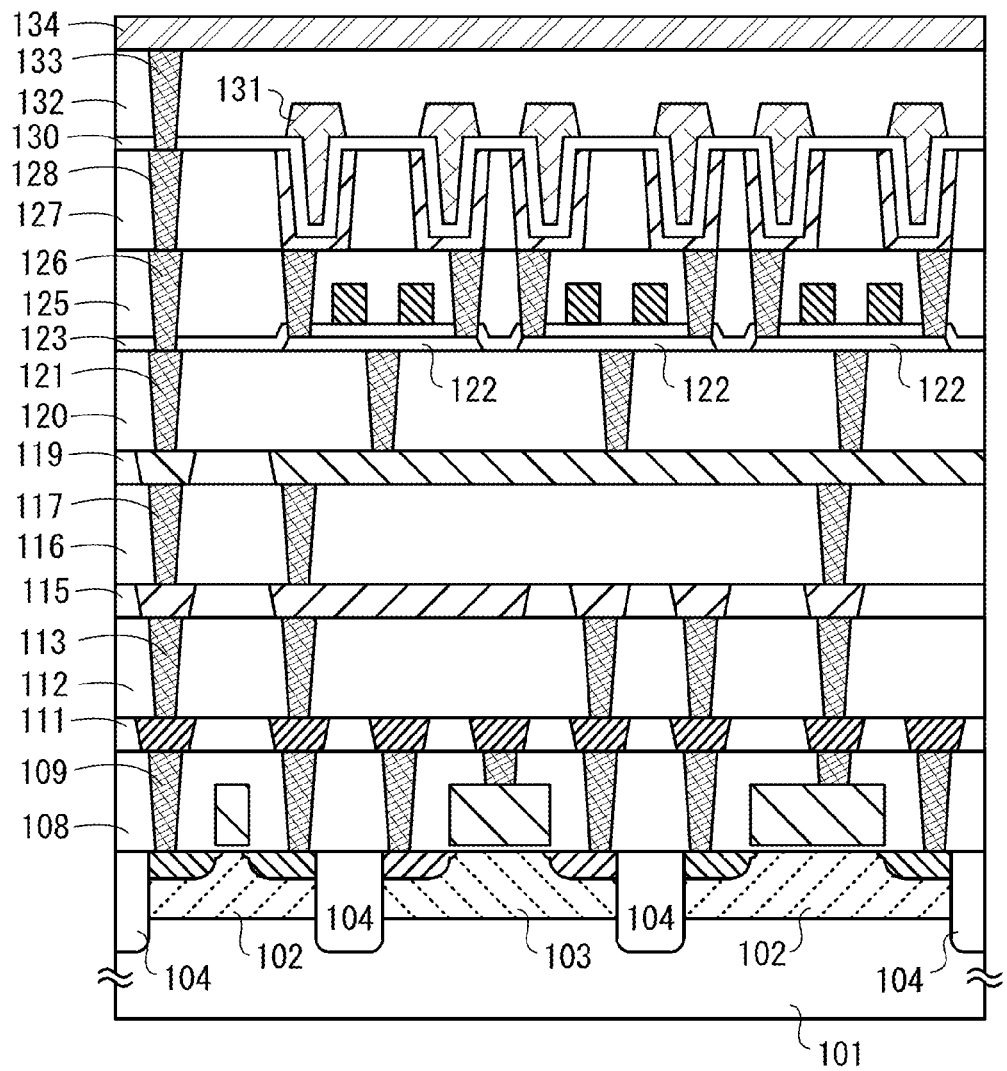
FIG. 8 is a diagram illustrating an example of a stacked structure of a semiconductor memory device of the present invention.
Figure 9A:
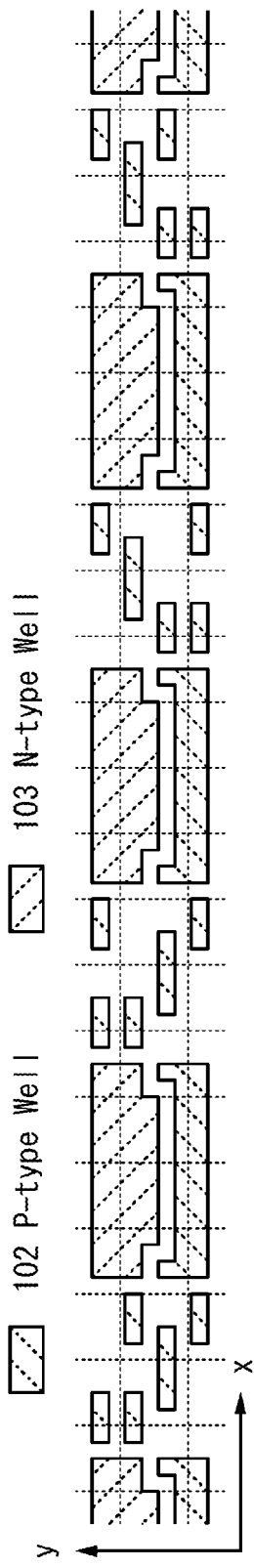
FIGS. 9A to 9C are diagrams illustrating an example of a layout of a semiconductor memory device of the present invention.
Figure 9B:
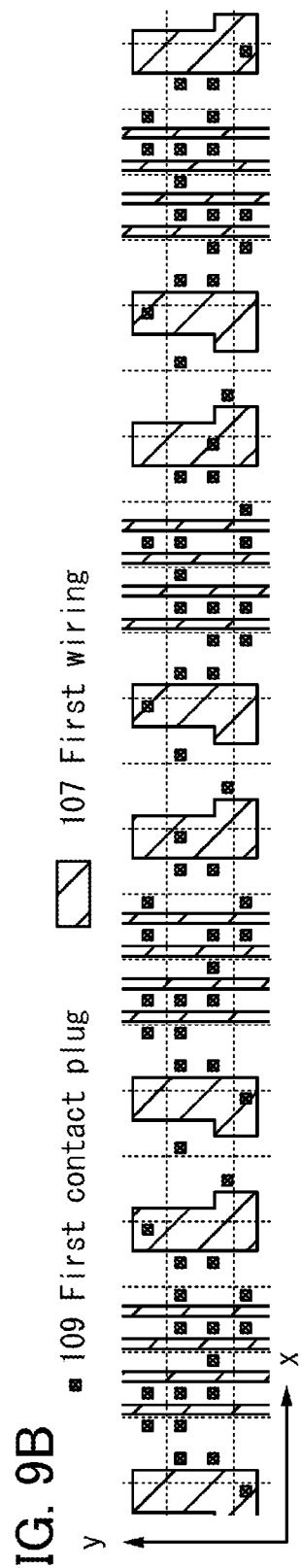
Figure 9C:
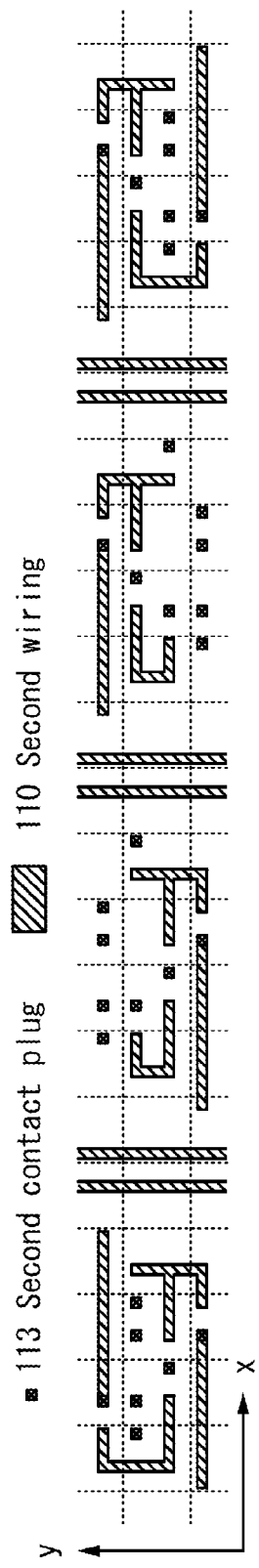

First, a stacked structure of the semiconductor memory device of one embodiment of the present invention is schematically described with reference to FIG. 8. For the detail, the well-known semiconductor integrated circuit manufacturing technique, Patent Document 2, and the like may be referred to. Note that FIG. 8 is not a view illustrating a particular cross section.

The semiconductor memory device is formed over a substrate 101 having a single crystal semiconductor surface. A p-well 102, an n-well 103, and an element separation insulator 104 are formed over the substrate 101. Further, an n-type region 105, a p-type region 106, and a first wiring 107 are formed.

The first wiring 107 serves as a gate of a transistor. Since in particular, transistors used for an amplifier circuit such as an inverter are required to have few variations between threshold values, each of the widths of wirings serving as gates of the transistors is preferably larger than a feature size to make a channel area larger.

When an inverter is formed using an n-channel transistor and a p-channel transistor, the channel lengths and the channel widths are desirably determined in consideration of their mobility so that on-state characteristics of the n-channel transistor and the p-channel transistor are nearly symmetrized. Further, in consideration of variations in threshold value and a capacitance ratio between the sub bit line and a channel, the channel areas of the n-channel transistor and the p-channel transistor are preferably almost equivalent. That is, the channel area of the n-channel transistor is preferably designed to be 80% or higher and 125% or lower of the channel area of the p-channel transistor.

For example, when the n-channel transistor and the p-channel transistor have a rectangle channel, the channel length of the n-channel transistor, the channel width of the re-channel transistor, the channel length of the p-channel transistor, and the channel width of the p-channel transistor are set to 5F, 3F, 3F, and 5F, respectively; thus, the channel areas can be almost equivalent and on-state currents can be almost equivalent. In addition, since these channel areas are 15 times as large as a usual channel area, variations in threshold value can be reduced. The variations in threshold value is inversely proportional to the square root of the channel area and therefore is approximately one fourth of the variations in threshold value of a transistor with a channel area of 1 $F^2$.

Similarly, the channel length of the n-channel transistor, the channel width of the re-channel transistor, the channel length of the p-channel transistor, and the channel width of the p-channel transistor may be set to 7F, 4F, 4F, and 7F, respectively. Alternatively, the channel length of the n-channel transistor, the channel width of the n-channel transistor, the channel length of the p-channel transistor, and the channel width of the p-channel transistor may be set to 12F, 7F, 7F, and 12F, respectively.

Alternatively, when it is difficult to form such a rectangle channel because of a layout, the channel may be designed to have a polygonal shape or the like so that the on-state current and the channel area that are needed in practice can be obtained.

In the case of general semiconductor integrated circuits, formation of many transistors each having such a large channel area leads to a decrease in integration degree. However, in the case of the semiconductor memory device of one embodiment of the present invention, memory cells can be three-dimensionally formed over these transistors; accordingly, the integration degree does not lowered.

A first interlayer insulator 108 is formed to cover the first wiring 107 and then a first contact plug 109 is formed. Further, a second wiring 110 and a first embedded insulator 111 are formed over the first interlayer insulator 108.

A second interlayer insulator 112, a second contact plug 113, a third wiring 114, and a second embedded insulator 115 are formed thereover. Similarly, a third interlayer insulator 116, a third contact plug 117, a fourth wiring 118, a third embedded insulator 119, a fourth interlayer insulator 120, and a fourth contact plug 121 are formed. Note that part of the fourth wiring 118 serves as a sub bit line.

A semiconductor layer 122 and a gate insulator 123 that is formed to cover the semiconductor layer 122 are provided over the fourth interlayer insulator 120. The semiconductor layer 122 may be partly or selectively doped. Further, a fifth wiring 124 serving as a word line, a fifth interlayer insulator 125, and a fifth contact plug 126 are formed. Part of the fifth contact plug 126 is connected to the semiconductor layer 122. A sixth interlayer insulator 127 and a sixth contact plug 128 are formed thereover.

In an opening of the sixth interlayer insulator 127, the thin-film sixth wiring 129 is formed to cover the side surface and the bottom surface of the opening. The sixth wiring 129 serves as an electrode of a capacitor of the memory cell. The height of the capacitor of the memory cell depends on the thickness of the sixth interlayer insulator 127. In the semiconductor memory device of one embodiment of the present invention, the capacitance of the capacitor can be 1 fF or lower; accordingly, the height can be 0.3 μm or less.

In addition, a dielectric film 130 is formed to cover the sixth wiring 129. Then, the seventh wiring 131 is provided over the dielectric film 130 so as to cover the opening of the sixth interlayer insulator 127. Part of the seventh wiring 131 serves as a counter electrode of the capacitor of the memory cell. The seventh wiring 131 is preferably provided to be parallel with the fifth wiring 124.

Further, a seventh interlayer insulator 132, the seventh contact plug 133, and an eighth wiring 134 are formed thereover. The eighth wiring 134 serves as a bit line. The height of the capacitor is made to be 0.3 μm or less as described above; accordingly, a BOC structure in which the bit line is formed over the capacitor can be employed, so that the integration degree can be increased.

Figure 10A:
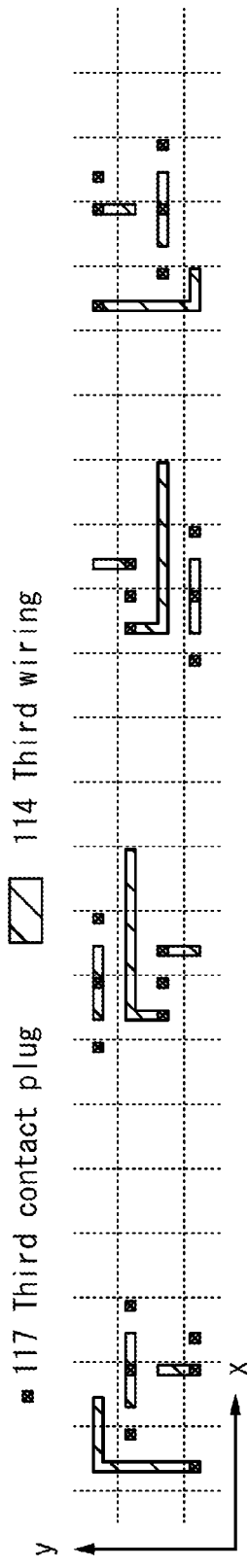
FIGS. 10A to 10C are diagrams illustrating an example of a layout of a semiconductor memory device of the present invention.
Figure 10B:
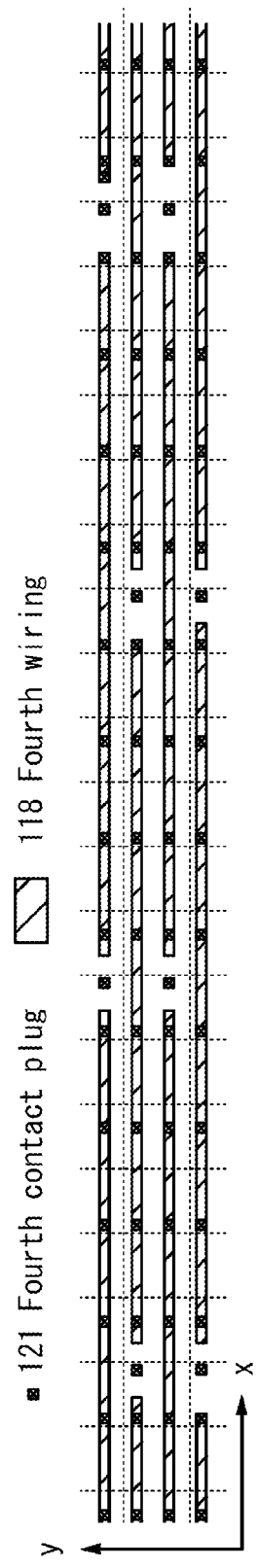
Figure 10C:
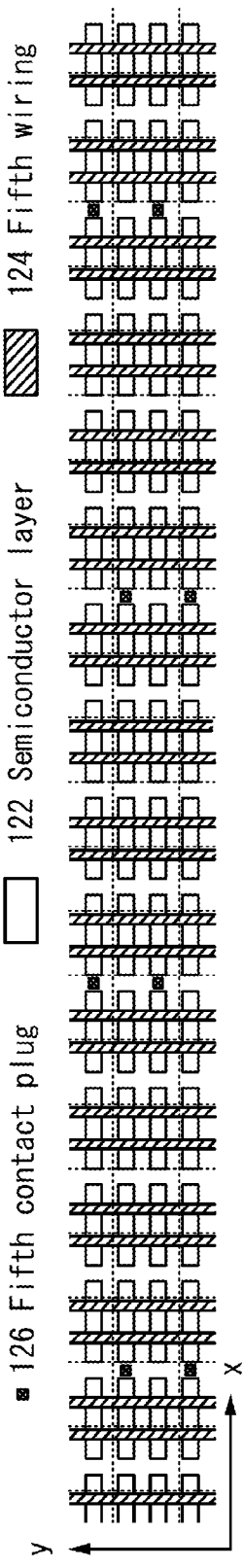

FIGS. 9A to 9C and FIGS. 10A to 10C show the positions of the following elements: the p-well 102, the n-well 103 (up to here, FIG. 9A), the first wiring 107, the first contact plug 109 (up to here, FIG. 9B), the second wiring 110, the second contact plug 113 (up to here, FIG. 9C), the third wiring 114, the third contact plug 117 (up to here, FIG. 10A), the fourth wiring 118, the fourth contact plug 121 (up to here, FIG. 10B), the semiconductor layer 122, the fifth wiring 124, and the fifth contact plug 126 (up to here, FIG. 10C).

In parts illustrated in FIGS. 9A to 9C and FIGS. 10A to 10C, four memory blocks are provided in an x direction (bit line direction) and four bit lines are provided in a y direction (word line direction). In the semiconductor memory device, one amplifier circuit is provided to occupy the width of four bit line. The amplifier circuit shown here has a circuit configuration equivalent to that illustrated in FIG. 4A.

In order to reduce the number of first wirings in the word line direction, a structure is employed in which the third selection transistors in FIGS. 4A and 4B and the first selection transistors in another memory block are controlled at the same time. Note that the structure hardly poses an operation problem.

Figure 11:
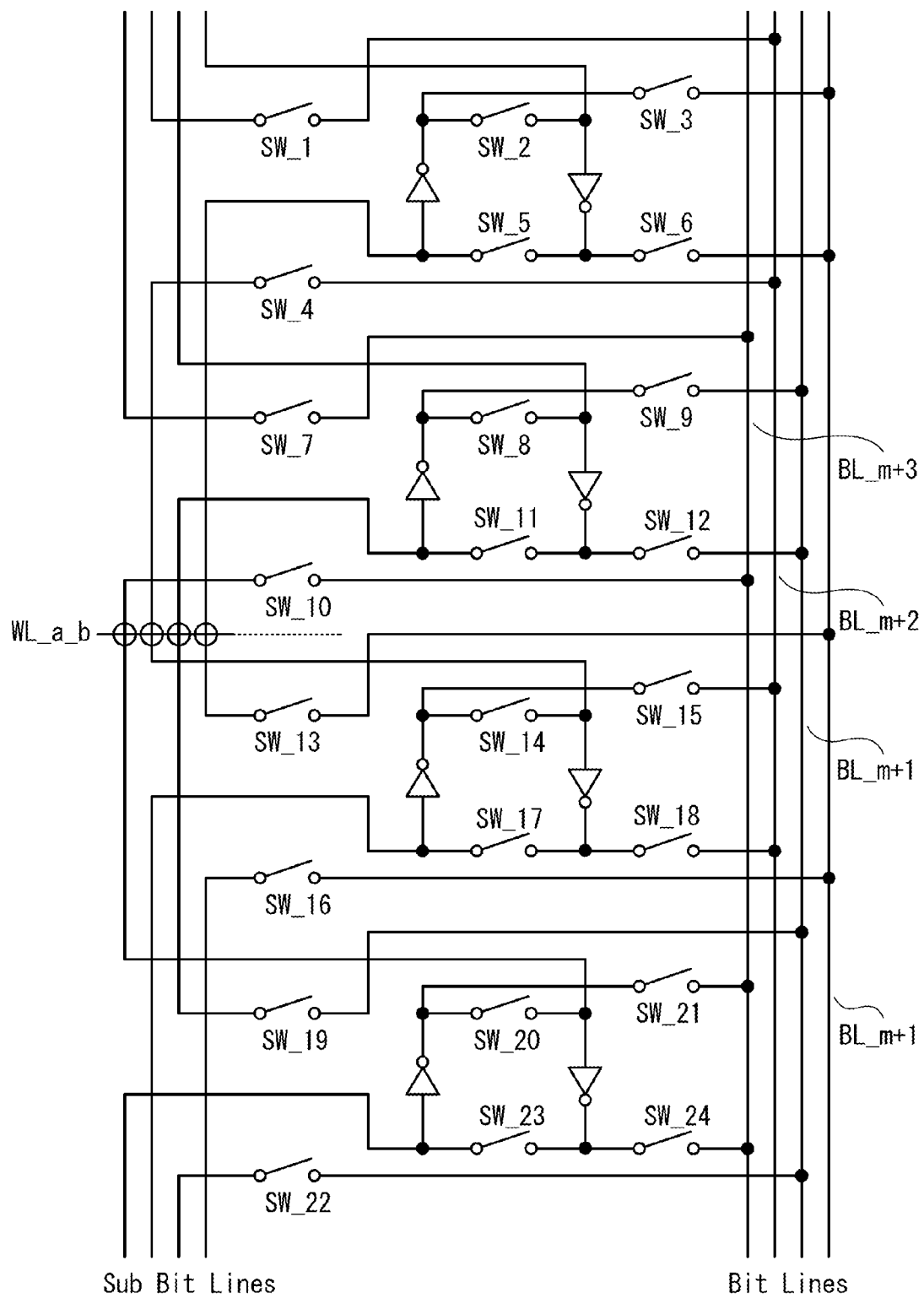
FIG. 11 is a diagram illustrating an example of a circuit of a semiconductor memory device of the present invention.

FIG. 11 illustrates a circuit diagram of the parts in the case where the layout shown in FIGS. 9A to 9C and FIGS. 10A to 10C are used. The first selection transistor STr1, the second selection transistor STr2, and the third selection transistor STr3 are each denoted by a switch SW. A switch SW_1, a switch SW_4, a switch SW_7, a switch SW_10, a switch SW_13, a switch SW_16, a switch SW_19, and a switch SW_22 in FIG. 11 correspond to the first selection transistors STr1; a switch SW_2, a switch SW_5, a switch SW_8, a switch SW_11, a switch SW_14, a switch SW_17, a switch SW_20, and a switch SW_23 in FIG. 11 correspond to the third selection transistors STr3; and a switch SW_3, a switch SW_6, a switch SW_9, a switch SW_12, a switch SW_15, a switch SW_18, a switch SW_21, and a switch SW_24 in FIG. 11 correspond to the second selection transistors STr2.

The first selection transistor STr1 is operated in conjunction with the third selection transistor STr3 as shown above. That is, a switch SW_3n+1 and a switch SW_3n+2 (n is an integer larger than zero) are operated in conjunction with each other. When one of them is turned on, the other is also turned on. When one of them is turned off, the other is also turned off.

For example, when a sub bit line connected to the switch SW_13 is precharged or data is written to the memory cell connected to the sub bit line by operating the switch SW_13, the switch SW_14 is operated at the same time.

Here, for example, the case where data of memory cells (denoted by circles in the diagram) connected to a word line WL_a_b in the diagram is read is considered. First, the sub bit lines connected to these memory cells are needed to be precharged. For that purpose, the switch SW_4, the switch SW_10, the switch SW_13, and the switch SW_19 are required to be turned on; concurrently, the switch SW_5, the switch SW_11, the switch SW_14, and the switch SW_20 are also turned on.

These switches connect output terminals of inverters and the sub bit lines and therefore a problem is possibly caused when the inverters are active. Thus, in this step (precharge step), the inverters are preferably inactive. That is, in a usual case, the potential of a high potential power supply of the inverter is made to be equivalent to the potential of a low potential power supply of the inverter, so that the result value becomes a middle value between the potential of the high potential power supply of the inverter that is active and the potential of the low potential power supply of the inverter that is active.

Next, the switch SW_4, the switch SW_10, the switch SW_13, and the switch SW_19 are turned off so that the sub bit lines connected to them become a floating state. Concurrently, the switch SW_5, the switch SW_11, the switch SW_14, and the switch SW_20 are also turned off.

After that, the inverters are activated, and further, the switch SW_2, the switch SW_8, the switch SW_17, and the switch SW_23 are turned on; thus, a path in which the sub bit line and two inverters are connected in series is made. At that time, the switch SW_1, the switch SW_7, the switch SW_16, and the switch SW_22 are concurrently turned on, which does not hamper data reading because these switches are not connected to the sub bit line to be read.

Note that in the case where a potential difference is amplified in conventional DRAM, the power supply voltage is gradually changed to avoid amplification errors when inverters in a flip flop circuit are activated. However, in the semiconductor memory device of one embodiment of the present invention, the inverters does not form the flip flop circuit in this stage; therefore, the power supply voltage can be changed more quickly when the inverter is activated.

Further, the switch SW_6, the switch SW_12, the switch SW_15, and the switch SW_21 are turned on to connect the inverters and the bit lines. Since any of these switches can be separately controlled, another switch is not turned on in the step.

Then, the switch SW_4, the switch SW_10, the switch SW_13, and the switch SW_19 are turned on again to connect the bit lines and the sub bit lines. As described above, when these switches are turned on, in conjunction with them, the switch SW_5, the switch SW_11, the switch SW_14, and the switch SW_20 are also turned on.

These switches form loops of flip flops by using the switch SW_2, the switch SW_8, the switch SW_17, and the switch SW_23, which are already turned on, and two inverters which are connected to these switches. Note that in this stage, the potential of the bit line is at the level at which the potential is hardly affected by noise; accordingly, data reading is not hampered.

When data restoration or data rewriting is completed, the switch SW_4, the switch SW_10, the switch SW_13, and the switch SW_19 are turned off. In conjunction with them, the switch SW_5, the switch SW_11, the switch SW_14, and the switch SW_20 are turned off. Concurrently, the inverters are preferably inactivated.

Embodiment 5

In Embodiment 1 and Embodiment 4, the first selection transistor is used when the sub bit line is precharged or when data is written to the memory cell connected to the sub bit line. However, without the first selection transistor, it is possible to precharge the sub bit line and to write data to the memory cell connected to the sub bit line. The amplifier circuit to be used is illustrated in FIG. 4A.

Figure 13A:
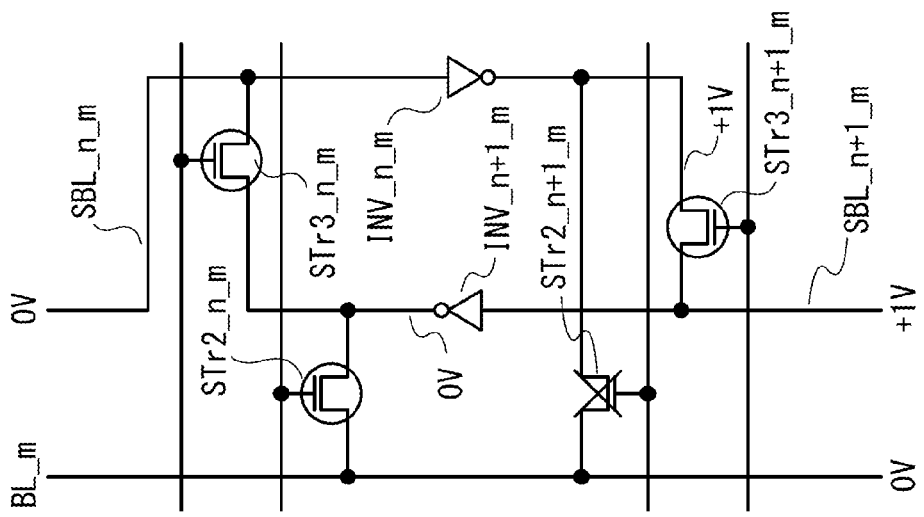
FIGS. 13A to 13C are diagrams illustrating an example of a method for driving a semiconductor memory device of the present invention.

If the first selection transistor and the first selection line for controlling the first selection transistor are not necessary, the integration degree of the semiconductor memory device can be enhanced. An example of a driving method is described below with reference to FIGS. 13A to 13C.

First, a precharging method is described. In the case where the sub bit line SBL_n_m is precharged, the second selection transistor STr2_$n$_m and the third selection transistor STr3_$n$_m are turned on, and the bit line BL_m and the sub bit line SBL_n_m are connected; therefore, the sub bit line SBL_n_m is precharged at the potential of the bit line BL_m (see FIG. 13A).

In this case, the potential of the inverter INV_n+1_m affects the potential of the sub bit lines or/and the like if the inverter INV_n+1_m is active; accordingly, the inverter INV_n+1_m is preferably inactive (e.g., the potentials of two power sources of the inverters (the potentials of sources of two transistors included therein) are both +0.5 V). Note that even when the inverter is inactive, the inverter outputs the potential at the same level of the potential of the power source in some cases. As long as the inverter INV_n+1_m is inactive, the sub bit line SBL_n+1_m may have any potential.

After completion of precharging the sub bit lines, the third selection transistor STr3_$n$_m is turned off. The second selection transistor STr2_$n$_m may remain in an on state. Steps for reading data and steps for rewriting data are the same until this stage.

Data reading is performed as follows. First, as described in Embodiment 1, the third selection transistor STr3_$n$+1_m and the second selection transistor STr2_$n$_m are turned on and the inverter INV_n_m and the inverter INV_n+1_m are activated. As a result, the following path is made: the sub bit line SBL_n_m→the inverter INV_n_m→the third selection transistor STr3_$n$+1_m→the second selection transistor STr2_$n$_m→the bit line BL_m.

In this embodiment, when the second selection transistor STr2_$n$_m remains in on state from the above-described precharging step, only the third selection transistor STr3_$n$+1_m may be turned on.

Then, the sub bit line SBL_n_m becomes a floating state and electric charges accumulated in the capacitor in any of the memory cells connected to the sub bit line SBL_n_m are discharged to the sub bit line SBL_n_m, so that the potential of the sub bit line SBL_n_m is changed from a precharge potential, and the potential corresponding thereto is amplified by the inverter INV_n_m and the inverter INV_n+1_m and output to the bit line BL_m.

As a result, electric charges corresponding to data to the bit line BL_m are accumulated and the potential of the bit line BL_m is changed. When the potential of the bit line BL_m becomes the level at which the potential is hardly affected by noise (refer to Embodiment 1) after a predetermined period passes, the third selection transistor STr3_$n$_m is turned on. As a result, the potential of the sub bit line SBL_n_m is charged by the potential of the bit line BL_m, whereby data is restored.

Data is rewritten as follows. First, depending on the data to be rewritten, the potential of the bit line BL_m is kept to be lower than the precharge potential (preferably, 0 V or lower) or higher than the precharge potential (preferably, +1 V or higher). In the following example, the case where the potential of the sub bit line SBL_n_m is changed to 0 V that is the potential having an opposite phase to data that has been written is described. Therefore, the potential of the bit line BL_m is set to be 0 V.

Further, similarly to the case of reading data, the third selection transistor STr3_$n$+1_m and the second selection transistor STr2_$n$_m are turned on and the inverter INV_n_m and the inverter INV_n+1_m are activated. As a result, a path from the sub bit line SBL_n_m to the bit line BL_m via two inverters is made. When the second selection transistor STr2_$n$_m remains in an on state from the precharging step, only the third selection transistor STr3_$n$+1_m may be turned on.

Electric charges of any of the memory cells connected to the sub bit line SBL_n_m is discharged to the sub bit line SBL_n_m, so that the potential of the sub bit line SBL_n_m is changed from the precharge potential (+0.55 V in FIG. 13B), and the potential corresponding thereto is amplified by the inverter INV_n_m and the inverter INV_n+1_m and output to the bit line BL_m. However, the bit line BL_m is kept at 0 V, and therefore the potential of the bit line BL_m is not sufficiently increased; as a result, current flows through the bit line BL_m (see FIG. 13B).

After that, the third selection transistor STr3_$n$_m is turned on to form a flip flop circuit in which an output of the inverter INV_n+1_m is input to the inverter INV_n_m.

As a result, the potential of the sub bit line SBL_n_m is charged by the potential of the bit line BL_m. Moreover, since the input potential of the inverter INV_n_m is approximately 0 V, the output potential of the inverter INV_n+1_m (the potential of the bit line BL_m) becomes 0 V. That is, the phases of the input potentials and the output potentials of the inverter INV_n_m and the inverter INV_n+1_m are inverted from the initial phases (see FIG. 13C).

Figure 13B:
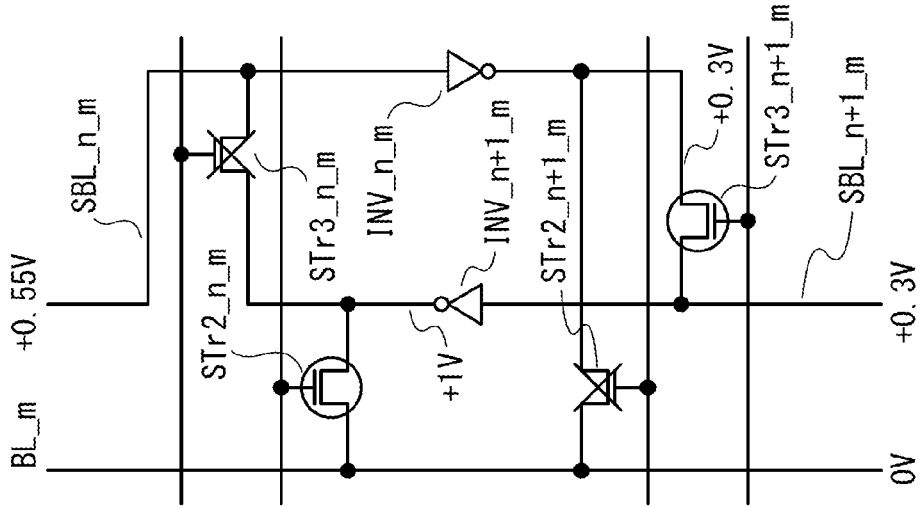
Figure 13C:
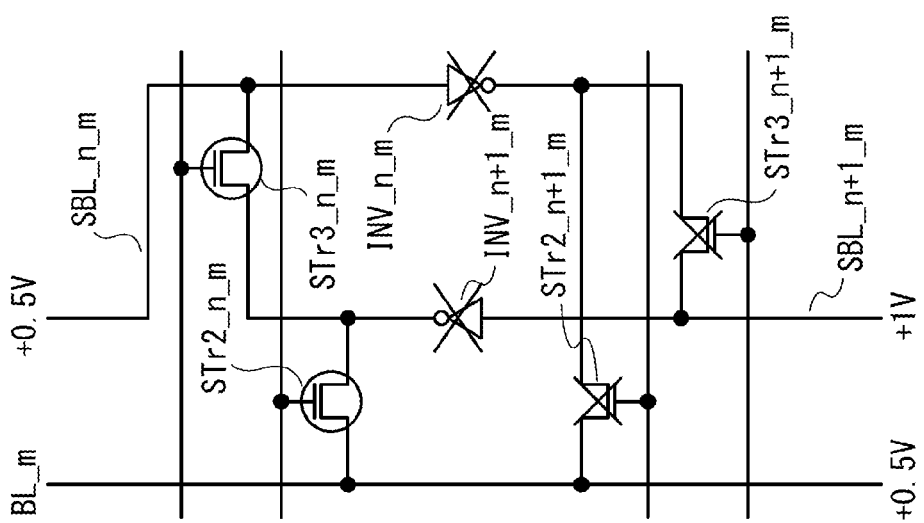

In the case of rewriting data, as illustrated in FIG. 13B, current flows through the bit line BL_m for a while from when the inverter INV is activated. Therefore, in comparison with the case of including the first selection transistor STr1, more power is consumed.

Note that the current is mainly determined by the characteristics of the inverter INV_n+1_m; therefore, to reduce power consumption, it seems that on-state current of the transistor included in the inverter INV_n+1_m is preferably low. On the other hand, a high on-state current allows the potential of the bit line BL_m to be stabilized for a shorter time. That is, time during which current flows through the bit line BL_m becomes shorter. The amount of electric charge flowing through the bit line BL_m is obtained by the product of current and time, and therefore, is generally nothing to do with the amount of on-state current of the transistor included in the inverter INV_n+1_m.

Timing of activating the inverter INV and timing of turning on the third selection transistor STr3_$n$_m are optimized, so that the amount of electric charge flowing through the bit line BL_m in a state illustrated in FIG. 13B can be suppressed to a few times the amount of electric charge for charging the bit line BL_m.

Embodiment 6

In this embodiment, an example of a method for driving the semiconductor memory device using the memory block that does not have the first selection transistor similarly to Embodiment 5 will be described. An example of the driving method in that case is described below. Note that the semiconductor memory device to be used is a circuit with a configuration in which the circuit illustrated in FIG. 4A is applied to the configuration illustrated in FIG. 1A as an amplifier circuit (not including the first selection transistor STr1). Data reading, data restoring, or data rewriting from/to one of the memory cells of the memory block MB_n_m is described.
<Precharge>

Similarly to Embodiment 5, the second selection transistor STr2_$n$_m and the third selection transistor STr3_$n$_m are turned on to precharge the sub bit line SBL_n_m with the potential of the bit line BL_m. The inverter INV_n+1_m is inactivated (i.e., each of two power supply potentials of the inverters is +0.5 V). After the completion of the precharge, the third selection transistor STr3_$n$_m is turned off.
<Data Reading>

The third selection transistor STr3_$n$+1_m is turned on to activate the inverter INV_n_m and the inverter INV_n+1_m, whereby the following path is made: the sub bit line SBL_n_m→the inverter INV_n_m→the third selection transistor STr3_$n$+1_m→the second selection transistor STr2_$n$_m→the bit line BL_m.

Then, the sub bit line SBL_n_m becomes a floating state and electric charges accumulated in the capacitor in any of the memory cells connected to the sub bit line SBL_n_m are discharged to the sub bit line SBL_n_m, so that the potential of the sub bit line SBL_n_m is changed from a precharge potential, and the potential corresponding thereto is amplified by the inverter INV_n_m and the inverter INV_n+1_m and output to the bit line BL_m.

As a result, electric charges corresponding to data to the bit line BL_m are accumulated and the potential of the bit line BL_m is changed. When the potential of the bit line BL_m becomes the level at which the potential is hardly affected by noise (refer to Embodiment 1) after a predetermined period passes, the third selection transistor STr3_$n$_m is turned on. As a result, a flip flop circuit is formed and the potential of the bit line BL_m is amplified. Alternatively, if a sense amplifier is connected to the bit line BL_m, the potential of the bit line BL_m may be amplified with it. The potential of the bit line BL_m at this time is read, whereby data can be read.

After that, the second selection transistor STr2_$n$_m is turned off and the inverter INV_n_m and the inverter INV_n+1_m are inactivated. As a result, the potentials of the sub bit line SBL_n_m and the sub bit line SBL_n+1_m become values which are nothing to do with the data (e.g., +0.5 V). However, the bit line BL_m can retain the potential corresponding to the data. Then, <Data Restoring> or <Data Rewriting> is performed.
<Data Restoring>

In the case of restoring data, the second selection transistor STr2_$n$_m is turned on and the inverter INV_n_m and the inverter INV_n+1_m are activated. In this case, the potential difference between the bit line BL_m and the sub bit line SBL_n+1_m is amplified, so that the potential of the sub bit line SBL_n+1_m has an opposite phase to the potentials of the bit line BL_m and the sub bit line SBL_n_m.

The potential of the sub bit line SBL_n_m is the same as the potential of the bit line BL_m (i.e., the potential corresponding to the read data). The transistor of the memory cell from which the data is read remains in an on state; accordingly, the capacitor is charged with the potential of the bit line BL_m, whereby the data is restored.
<Data Rewriting>

In the case of rewriting data, after the potential of the bit line BL_m is made to correspond to the data, the second selection transistor STr2_$n$_m is turned on and the inverter INV_n_m and the inverter INV_n+1_m are activated. As a result, the potential of the sub bit line SBL_n_m becomes the same as the potential of the bit line BL_m (i.e., the potential corresponding to the rewritten data). The transistor of the memory cell from which the data is read remains in an on state; accordingly, the capacitor is charged with the potential of the bit line BL_m, whereby the data is rewritten.

This application is based on Japanese Patent Application serial no. 2011-232372 filed with Japan Patent Office on Oct. 24, 2011, the entire contents of which are hereby incorporated by reference.

What is claimed is:

1. A semiconductor device comprising:
   a bit line;
   a first sub bit line;
   a second sub bit line;
   a first transistor;
   a second transistor;
   an amplifier circuit; and
   a first memory block and a second memory block each including two or more memory cells,
   wherein the first memory block is electrically connected to the first sub bit line and the second memory block is electrically connected to the second sub bit line,
   wherein the first sub bit line is electrically connected to a first input terminal of the amplifier circuit, wherein a first output terminal of the amplifier circuit is electrically connected to the bit line through the first transistor, wherein the second sub bit line electrically connected to the second memory block is electrically connected to a second input terminal of the amplifier circuit, and wherein a second output terminal of the amplifier circuit is electrically connected to the bit line through the second transistor.

2. The semiconductor device according to claim 1, further comprising a first selection transistor and a second selection transistor, wherein the first selection transistor is electrically connected to the bit line and the first sub bit line, and wherein the second selection transistor is electrically connected to the bit line and the second sub bit line.

3. The semiconductor device according to claim 1, wherein each of the two or more memory cells includes a transistor, wherein a semiconductor used for the first transistor is different from a semiconductor used for the transistor.

4. The semiconductor device according to claim 1, further comprising a transistor provided in each of the two or more memory cells, wherein in the first memory block and the second memory block, the transistor in one of two or more memory cells is provided in a different layer from a transistor of another memory cell.

5. The semiconductor device according to claim 1, wherein the amplifier circuit includes complementary inverters.

6. The semiconductor device according to claim 1, wherein a BOC structure is employed.

7. A method for driving the semiconductor device according to claim 1, wherein in a period during which only one of the first transistor and the second transistor is in an on state, the other of the first transistor and the second transistor is turned off.

8. A semiconductor device comprising:
a first bit line;
a second bit line;
a first sub bit line;
a second sub bit line;
a third sub bit line;
a fourth sub bit line;
a first transistor;
a second transistor;
a third transistor;
a fourth transistor;
an amplifier circuit;
a first memory block;
a second memory block;
a third memory block; and
a fourth memory block,
wherein the first memory block, the second memory block, the third memory block, and the forth memory block each include two or more memory cells,
wherein the first memory block, the second memory block, the third memory block, and the fourth memory block are electrically connected to the first sub bit line, the second sub bit line, the third sub bit line, and the fourth sub bit line, respectively, wherein the first sub bit line is electrically connected to a first terminal of the amplifier circuit, wherein the second sub bit line is electrically connected to a second input terminal of amplifier circuit, wherein the third sub bit line is electrically connected to a third input terminal of the amplifier circuit, wherein the forth sub bit line is electrically connected to a fourth input terminal of the amplifier circuit, wherein a first output terminal of the amplifier circuit is electrically connected to the first bit line through the first transistor, wherein a second output terminal of the amplifier circuit is electrically connected to the first bit line through the second transistor, wherein a third output terminal of the amplifier circuit is electrically connected to the second bit line through the third transistor, and wherein a fourth output terminal of the amplifier circuit is electrically connected to the second bit line through the fourth transistor.

9. The semiconductor device according to claim 8, further comprising a first selection transistor, a second selection transistor, a third selection transistor, and a fourth selection transistor, wherein the first selection transistor is electrically connected to the first bit line and the first sub bit line, wherein the second selection transistor is electrically connected to the first bit line and the second sub bit line, wherein the third selection transistor is electrically connected to the second bit line and the third sub bit line, and wherein the fourth selection transistor is electrically connected to the second bit line and the fourth sub bit line.

10. The semiconductor device according to claim 8, wherein each of the two or more memory cells includes a transistor, wherein a semiconductor used for the first transistor is different from a semiconductor used for the transistor.

11. The semiconductor device according to claim 8, further comprising a transistor provided in each of the two or more memory cells, wherein in the first memory block, the second memory block, the third memory block, and the fourth memory block, the transistor in one of two or more memory cells is provided in a different layer from a transistor of another memory cell.

12. The semiconductor device according to claim 8, wherein the amplifier circuit includes complementary inverters.

13. The semiconductor device according to claim 8, wherein a BOC structure is employed.

14. A method for driving the semiconductor device according to claim 8, wherein in a period during which only one of the first transistor and the second transistor is in an on state, the other of the first transistor and the second transistor is turned off.

* * * * *